United States Patent
Zhang et al.

(10) Patent No.: US 12,334,367 B2
(45) Date of Patent: Jun. 17, 2025

(54) METHOD AND APPARATUS FOR REMOVING PARTICLES OR PHOTORESIST ON SUBSTRATES

(71) Applicant: ACM RESEARCH (SHANGHAI), INC., Shanghai (CN)

(72) Inventors: Xiaoyan Zhang, Shanghai (CN); Wenjun Wang, Shanghai (CN); Fuping Chen, Shanghai (CN); Jun Wang, Shanghai (CN); Shena Jia, Shanghai (CN); Deyun Wang, Shanghai (CN); Hui Wang, Shanghai (CN); Guangyu Xia, Shanghai (CN); He Wang, Shanghai (CN)

(73) Assignee: ACM RESEARCH (SHANGHAI), INC., Shanghai (CN)

( * ) Notice: Subject to any disclaimer, the term of this patent is extended or adjusted under 35 U.S.C. 154(b) by 148 days.

(21) Appl. No.: 17/920,665

(22) PCT Filed: Apr. 21, 2020

(86) PCT No.: PCT/CN2020/085948
§ 371 (c)(1),
(2) Date: Oct. 21, 2022

(87) PCT Pub. No.: WO2021/212330
PCT Pub. Date: Oct. 28, 2021

(65) Prior Publication Data
US 2023/0143401 A1   May 11, 2023

(51) Int. Cl.
*H01L 21/311* (2006.01)
*H01L 21/3105* (2006.01)
*H01L 21/67* (2006.01)

(52) U.S. Cl.
CPC ...... *H01L 21/6704* (2013.01); *H01L 21/3105* (2013.01); *H01L 21/67086* (2013.01)

(58) Field of Classification Search
CPC ........... H01L 21/6704; H01L 21/67086; H01L 21/31133; H01L 21/67028; H01L 21/6719; H01L 21/67742; H01L 21/67173
See application file for complete search history.

(56) References Cited

U.S. PATENT DOCUMENTS 9,793,105 B1   10/2017   Yu et al.
2002/0062841 A1 *   5/2002   Twu ........................ B08B 3/08
                                                        134/28

(Continued)

FOREIGN PATENT DOCUMENTS

CN   102078869 A   6/2011
CN   103846245 A   6/2014

(Continued)

OTHER PUBLICATIONS

International Search Report issued in International Application No. PCT/CN2020/085948 dated Jan. 22, 2021 (4 pages).

(Continued)

*Primary Examiner* — Erin F Bergner
(74) *Attorney, Agent, or Firm* — OSHA BERGMAN WATANABE & BURTON LLP

(57) ABSTRACT

Methods and an apparatus for removing particles or photoresist on substrates. In an embodiment, a method comprises the following steps: transferring one or more substrates into a $DIO_3$ solution accommodated in a $DIO_3$ bath; after the one or more substrates are processed in the $DIO_3$ bath, taking the one or more substrates out from the $DIO_3$ bath and transferring the one or more substrates into a SPM solution accommodated in a SPM bath; after the one or more substrates are processed in the SPM bath, taking the one or more substrates out from the SPM bath and rinsing the one or more substrates; and transferring the one or more substrates to one or more single chambers to perform single substrate cleaning and drying process. The method com- (Continued)

bines $DIO_3$ and SPM in one cleaning sequence, which can remove particles or photoresist, especially remove photoresist treated by medium dose or high dose of ion implantation.

32 Claims, 13 Drawing Sheets

(56) References Cited

U.S. PATENT DOCUMENTS

| | | | |
|---|---|---|---|
| 2004/0040934 A1* | 3/2004 | Tai | H01L 21/31133 257/E21.255 |
| 2005/0026435 A1 | 2/2005 | Chen et al. | |
| 2007/0131246 A1 | 6/2007 | Izumi | |
| 2007/0148848 A1* | 6/2007 | Kim | H01L 21/823842 438/906 |
| 2007/0221254 A1* | 9/2007 | Izumi | H01L 21/02041 134/94.1 |
| 2015/0332940 A1* | 11/2015 | Wang | H01L 21/67781 134/25.1 |
| 2019/0374911 A1* | 12/2019 | Fujimura | H01L 21/02057 |

FOREIGN PATENT DOCUMENTS

| | | |
|---|---|---|
| CN | 104813438 B | 7/2017 |
| JP | H09237774 A | 9/1997 |
| JP | 4111308 B2 | 7/2008 |
| JP | 2016502275 A | 1/2016 |
| TW | 200308011 A | 12/2003 |
| TW | 200517795 A | 6/2005 |
| WO | 2019232741 A1 | 12/2019 |

OTHER PUBLICATIONS

Written Opinion issued in International Application No. PCT/CN2020/085948 dated Jan. 22, 2021 (4 pages).

Office Action issued in Japanese Application No. 2022-564278, mailed on Jun. 4, 2024 (6 pages).

Office Action issued in Japanese Application No. 2022-564278, mailed on Dec. 17, 2024 (4 pages).

Office Action issued in Korean Application No. 10-2022-7040496, mailed on Jul. 26, 2024 (61 pages).

Office Action issued in Taiwanese Application No. 110114416 (25 pages).

Office Action issued in corresponding SG Application No. 11202254123R dated Jan. 29, 2025 (13 pages).

Office Action issued in corresponding CN Application No. 202080099666.0 with English translation dated Feb. 15, 2025 (26 pages).

* cited by examiner

METHOD AND APPARATUS FOR REMOVING PARTICLES OR PHOTORESIST ON SUBSTRATES

BACKGROUND OF THE INVENTION

1. Field of the Invention

The present invention generally relates to a semiconductor wet cleaning field, and more particularly to a method and an apparatus for removing particles or photoresist on semiconductor substrates.

2. The Related Art

Conventionally, organic photoresist strip processes were developed via using a combination of dry and wet treatments. However, dry treatments based on reactive plasma ashing have been shown to present issues, such as plasma induced damage, resist popping, incomplete resist removal, and byproduct redeposition, consequently, it requires follow up with a wet stripping/cleaning. To avoid plasma issues, wet stripping processes based on organic solvents and aggressive acid chemistries, such as aqueous mixtures of sulfuric acid and hydrogen peroxide (SPM), were developed. Nowadays, SPM is widely used for photoresist stripping and post-resist strip cleaning processes.

In the past tens of years, SPM wet stripping process is typically carried out in a wet bench tool because of its high throughput, while maintaining a low cost of operation. However, today's SPM bench-only wet process cannot achieve the cleaning performance required for advanced technology nodes due to (1) the particle removal efficiency by wet bench tool has been reduced significantly when the particle sizes are reduced to 45 nm and below; (2) not able to remove photoresists treated by high dose (>1E17 ions/cm$^2$) of ion implantation because of limited temperature of SPM bath with normal temperature of 145° C. Single substrate wet stripping process seems to be an alternative solution for new generation of IC manufacture node which needs to remove particles smaller than 45 nm and clean photoresist treated by high dose of ion implantation due to its higher temperature of SPM (180° C.). However, single substrate SPM process requires the SPM mixture to be heated to high temperatures with only a fraction of the hot SPM touching the substrate surface and most of the SPM spinning off from the substrate, which cannot be reused due to loss of chemical energy. This process results in a great consumption of sulfuric acid, what's worse, disposal of waste is expensive and harmful to the environment.

In order to reduce environmental impact caused by large amount of SPM consumption, utilizing ozone chemistry for photoresist removal to replace SPM wet stripping process has been tried and tested. However, the cleaning efficiency especially for photoresist treated by medium dose (1E15 ions/cm$^2$) and high dose (>1E17 ions/cm$^2$) of ion implantation was much lower than that of high temperature (>180° C.) of single substrate SPM process.

From a removal efficient and environmental point of view, an integrated cleaning system and process method that combines a traditional bench SPM cleaning module and a single substrate cleaning module into one wet-clean system is disclosed in PCT patent application No. PCT/CN2018/090227, filed on Jun. 7, 2018. This system overcomes the challenges of traditional bench-only and single-only wet cleaning systems, using a two-step approach to optimize the advantages of wet bench and single substrate cleaning, achieving a cleaning efficiency that is comparable to the single substrate SPM cleaning while, at the same time, it allows the SPM to be recycled and reused and it greatly reduces the consumption of sulfuric acid. However, SPM temperature in bath is critical for wet stripping process for photoresist treated by high dose of ion implantation. But, a higher temperature can cause rapid decomposition of $H_2O_2$ or fast depletion of the $H_2O_2$, therefore SPM used in this system can only be heated as high as 150° C. It is clear that for the high energy-high dose implanted resist, 150° C. SPM cannot remove thick crust formed during ion implantation.

SUMMARY

The present invention discloses a method and an apparatus to remove fine particles at high efficiency and to remove photoresist and residuals treated by high energy and high dose ion implantation with much lower consumption of SPM chemicals.

More specifically, the present invention discloses a combination of $DIO_3$ and SPM substrate photoresist wet stripping method and a substrate photoresist wet stripping apparatus.

According to one embodiment of the present invention, a method for removing particles or photoresist from substrates comprises the following procedures: processing one or more substrates in a SPM bath and then in a DI water rinsing bath in a bench module, then keeping the one or more substrates being in wet state and transferring the one or more substrates to subsequent one or more single chambers of a single module to perform single substrate $DIO_3$ cleaning for remaining residues removal and final cleaning.

According to another embodiment of the present invention, a method for removing particles or photoresist from substrates comprises the following procedures: processing one or more substrates in a $DIO_3$ bath then in a SPM bath and then in a DI water rinsing bath in a bench module, then keeping the one or more substrates being in wet state and transferring the one or more substrates to subsequent one or more single chambers of a single module to perform single substrate cleaning for remaining residues removal and final cleaning.

According to another embodiment of the present invention, a method for removing particles or photoresist from substrates comprises the following procedures: processing one or more substrates in a HF bath then in a $DIO_3$ bath then in a SPM bath and then in a DI water rinsing bath in a bench module, then keeping the one or more substrates being in wet state and transferring the one or more substrates to subsequent one or more single chambers of a single module to perform single substrate cleaning for remaining residues removal and final cleaning According to another embodiment of the present invention, a method for removing particles or photoresist from substrates comprises the following procedures: processing one or more substrates in one or more single chambers of a single module to perform single substrate $DIO_3$ cleaning, then processing the one or more substrates in a SPM bath and then in a DI water rinsing bath in a bench module, then keeping the one or more substrates being in wet state and transferring the one or more substrates to the one or more single chambers of the single module to perform single substrate cleaning for remaining residues removal and final cleaning.

DETAILED DESCRIPTION OF EMBODIMENTS

During the SPM cleaning process, the challenges experienced are that viscous SPM is hard to rinse off and hygroscopic sulfur (S) residues adhere to the substrate surface and absorb moisture, which causes particulate defects are hard to remove after drying. Therefore, after the bench SPM processing, the substrate has to be transferred into a single process chamber with a wet status, which prevents the substrate surface from drying out to form watermark defects or to absorb ionic and particulate pollutants from the external environment.

Figure 1:
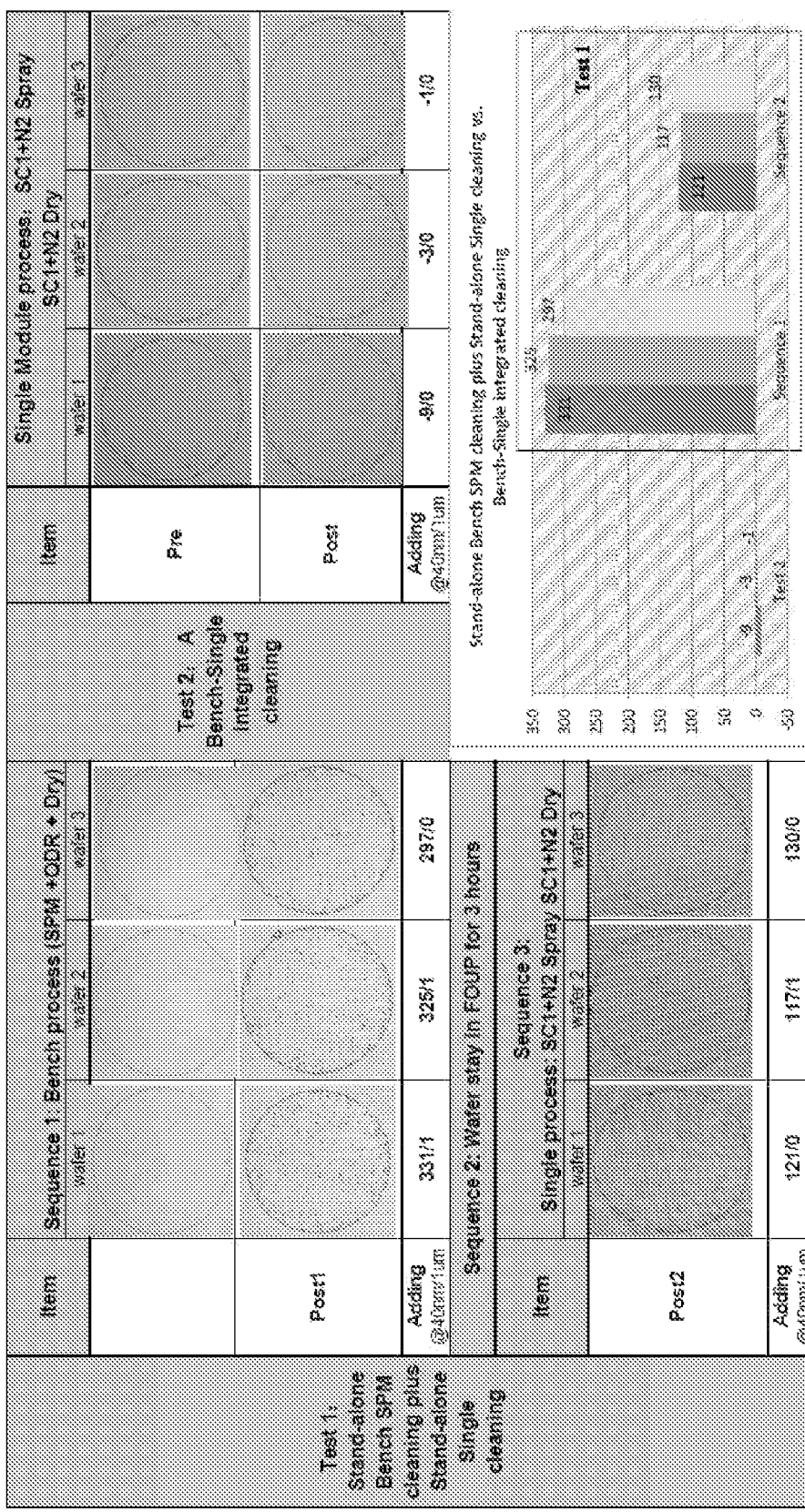
FIG. 1 illustrates cleaning performance comparison between stand-alone bench SPM cleaning plus stand-alone single cleaning and a Bench-Single integrated cleaning.

As shown in FIG. 1, a comparison test was designed to clarify cleaning performance between stand-alone bench SPM cleaning plus stand-alone single cleaning process and a Bench-Single integrated cleaning process.

Test 1: Stand-Alone Bench SPM Cleaning Plus Stand-Alone Single Cleaning a) Sequence 1: bench process: SPM+QDR (quick dump rinse)+Dry;

More specifically, the bench process is performed in a bench tool. The bench process comprises the steps: processing at least one wafer with SPM, rinsing the wafer by a way of QDR, and at last drying the wafer.

b) Sequence 2: the wafer stays in a FOUP for 3 hours; and c) Sequence 3: single process: SC1+$N_2$ Spray SC1+$N_2$ Dry.

More specifically, the single process is performed in a single wafer cleaning tool. The single process comprises the steps: processing the wafer with SC1, processing the wafer with SC1 which is atomized to generate fine droplets and accelerated by pressurized nitrogen gas through a gas-liquid atomizing spray nozzle ($N_2$ Spray SC1), rinsing the wafer with DIW, and at last drying the wafer with $N_2$.

Test 2: Bench-Single Integrated Cleaning

Bench process of Bench-Single integrated cleaning: SPM+QDR, and

Single process of Bench-Single integrated cleaning: SC1+$N_2$ Spray SC1+$N_2$ Dry.

More specifically, the bench process and the single process are performed in a Bench-Single integrated cleaning tool. The Bench-Single integrated cleaning process comprises the steps: processing at least one wafer with SPM and then rinsing the wafer by a way of QDR in a bench module of the Bench-Single integrated tool, then transferring the wafer to a single module of the Bench-Single integrated tool to perform the single process which further comprises processing the wafer with SC1, processing the wafer with SC1 which is atomized to generate fine droplets and accelerated by pressurized nitrogen gas through a gas-liquid atomizing spray nozzle ($N_2$ Spray SC1), rinsing the wafer with DIW, and at least drying the wafer with $N_2$.

Test 1 shows 40 nm particle add amount after the wafers have been run through the stand-alone bench SPM cleaning is 297-331. The wafers are then stored in the FOUP for 3 hours before being processed in the stand-alone single wafer cleaning tool, and 40 nm particle add amount shown in test 1 is decreased to 117~130. Also as shown in FIG. 1, the test 2 of Bench-Single integrated cleaning shows 40 nm particle add amount is decreased to −1~−9. FIG. 1 shows that the cleaning effect of the Bench-Single integrated cleaning is significantly better than the stand-alone bench SPM cleaning plus the stand-alone single cleaning. The key conclusion for getting better defect removal performance is to keep the wafer surface in a wet state between the post bench SPM cleaning process and the pre single wafer cleaning process. Because the defects are very difficult to remove even by a single wafer cleaning process after the wafer has been dried.

During the SPM cleaning process, it is very critical to control and keep a certain thickness of liquid film on the wafer surface between the post bench SPM cleaning process and the pre single wafer cleaning process, which can prevent the wafer surface from drying out to form watermark defects or to absorb ionic and particulate pollutants from the external environment. However, it should be noted that in actual application, even with a Bench-Single integrated cleaning system, a perfect wafer wetting status is hard to achieve, so that a $DIO_3$ and SPM combination cleaning process is disclosed in the present invention to eliminate the impacts during the wafer being transferred from the bench module to the single module. Furthermore, the residua of sulfur by products and particles attached on the wafer surface after the SPM process is harder to remove by SC1 only process.

In order to clarify a $DIO_3$ enhanced SPM cleaning performance, tests are carried out in a Bench-Single integrated cleaning tool with 12 inch bare silicon wafer, and particle amounts are measured on a KLA-Tencor Surfscan SP5 with 19 nm metrology recipe. As shown in Table 1, the test conditions are below:

Test 1: Bench process in the Bench-Single integrated cleaning tool: SPM+Hot QDR, plus Single process in the Bench-Single integrated cleaning tool: SC1+$N_2$ Spray SC1+$N_2$ Dry.

Test 2: Bench process in the Bench-Single integrated cleaning tool: SPM+Hot QDR, plus Single process in the Bench-Single integrated cleaning tool: $O_3$+SC1+$N_2$ Spray SC1+$N_2$ Dry.

Test 3: Bench process in the Bench-Single integrated cleaning tool: SPM+Hot QDR, plus Single process in the Bench-Single integrated cleaning tool: DHF+$O_3$+SC1+$N_2$ Spray SC1+$N_2$ Dry.

TABLE 1

$DIO_3$ enhanced SPM cleaning tests in a Bench-Single integrated cleaning tool

| Item | Bench process | Single process | PRE Count 19 nm | PRE Count 1 μm | POST Count 19 nm | POST Count 1 μm | Delta (Post-Pre) 19-30 nm | 30-40 nm | 40-60 nm | >60 nm | Total | PRE Total |
|---|---|---|---|---|---|---|---|---|---|---|---|---|
| Bench-Single integrated cleaning process | SPM-Hot QDR | Test 1: SC1-N2 Spray SC1-DIW: N2 Dry | 521 | 0 | 528 | 0 | −11 | 7 | 3 | −2 | −3 | 1% |
| | | | 301 | 0 | 308 | 0 | −8 | 11 | 9 | −7 | 5 | −2% |
| | | Test 2: O3-SC1-N2 Spray SC1-DIW: N2 Dry | 281 | 0 | 202 | 0 | −62 | −8 | −7 | −2 | −79 | 28% |
| | | | 272 | 0 | 198 | 0 | −55 | −5 | 1 | −15 | −74 | 27% |
| | | Test 3: DBF-O3-SC1-N2 Spray SC1-DIW: N2 Dry | 261 | 0 | 191 | 0 | −56 | −3 | −8 | −3 | −70 | 37% |
| | | | 283 | 0 | 198 | 0 | −64 | −8 | −3 | −3 | −97 | 34% |

Test shows combine bench SPM-hot QDR cleaning and the single cleaning in one sequence, after the single cleaning process with SC1-$N_2$ Spray SC1, particle has a little added. The single cleaning process with $O_3$-SC1-$N_2$ Spray SC1 can enhance particle remove. The single cleaning process with DHF-$O_3$-SC1-$N_2$ Spray SC1 has the best particle remove efficiency. The $DIO_3$ and SPM combination cleaning process shows a positive cleaning effect. Here, HF will undercut particles attached on the wafer surface, and $DIO_3$ will further remove sulfur by products and conditioning the wafer surface after the HF process.

For photoresist irradiated or treated by high dose (>1E17 ion/cm$^2$) and high energy (>10 KeV) ion implantation, the C—H inside photoresist are disordered, cross-linked and formed double bonds C═C or graphite structure. Those graphite structure materials form hard crust on the surface of photoresist, and are hard to remove unless using very high temperature (>180° C.). SPM with single wafer cleaning tool. However, with wet bench process, the temperature of SPM in a bath can only be heated to 150° C. or less due to quick decomposition of $H_2O_2$. Therefore it is critical to remove the crust which is being hardened in the ion implantation.

$O_3$ is a very strong oxidant. The $DIO_3$ process directly oxidizes C═C double bonds, and the resist becomes thinner during this reaction Taking the ozonolysis of alkenes mechanism for example, it involves the attack of ozone on the C═C double bonds and forms the molozonide intermediate which is quite unstable. Due to this unstable nature, the molozonide continues reacting—breaking apart to form a carbonyl molecule and a carbonyl oxide molecule. The carbonyl molecule and the carbonyl oxide molecule formed in the first step rearrange themselves, reforming to create a more stable ozonide intermediate. This ozonide intermediate can be subjected to either an oxidative workup or a reductive workup. The oxidative workup will give carboxylic acid as the product whereas the reductive workup will yield aldehydes or ketones.

After the crust being treated by $DIO_3$, and the remaining by products will be removed by SPM with temperature less than 150° C.

Therefore, for removing particles or photoresist, especially for removing photoresist treated by medium dose or high dose of ion implantation, the present invention discloses a plurality of methods which combine $DIO_3$ and SPM in one cleaning sequence.

According to one embodiment of the present invention, a method for removing particles or photoresist on substrates comprises a bench $DIO_3$-SPM combination process and a subsequent single cleaning process in an integrated sequence, the method comprising:

transferring one or more substrates into a $DIO_3$ solution accommodated in a $DIO_3$ bath;

after the one or more substrates are processed in the $DIO_3$ bath, taking the one or more substrates out from the $DIO_3$ bath and transferring the one or more substrates into a SPM solution accommodated in a SPM bath;

after the one or more substrates are processed in the SPM bath, taking the one or more substrates out from the SPM bath and rinsing the one or more substrates; and transferring the one or more substrates to one or more single chambers to perform single substrate cleaning and drying process.

Figure 2:
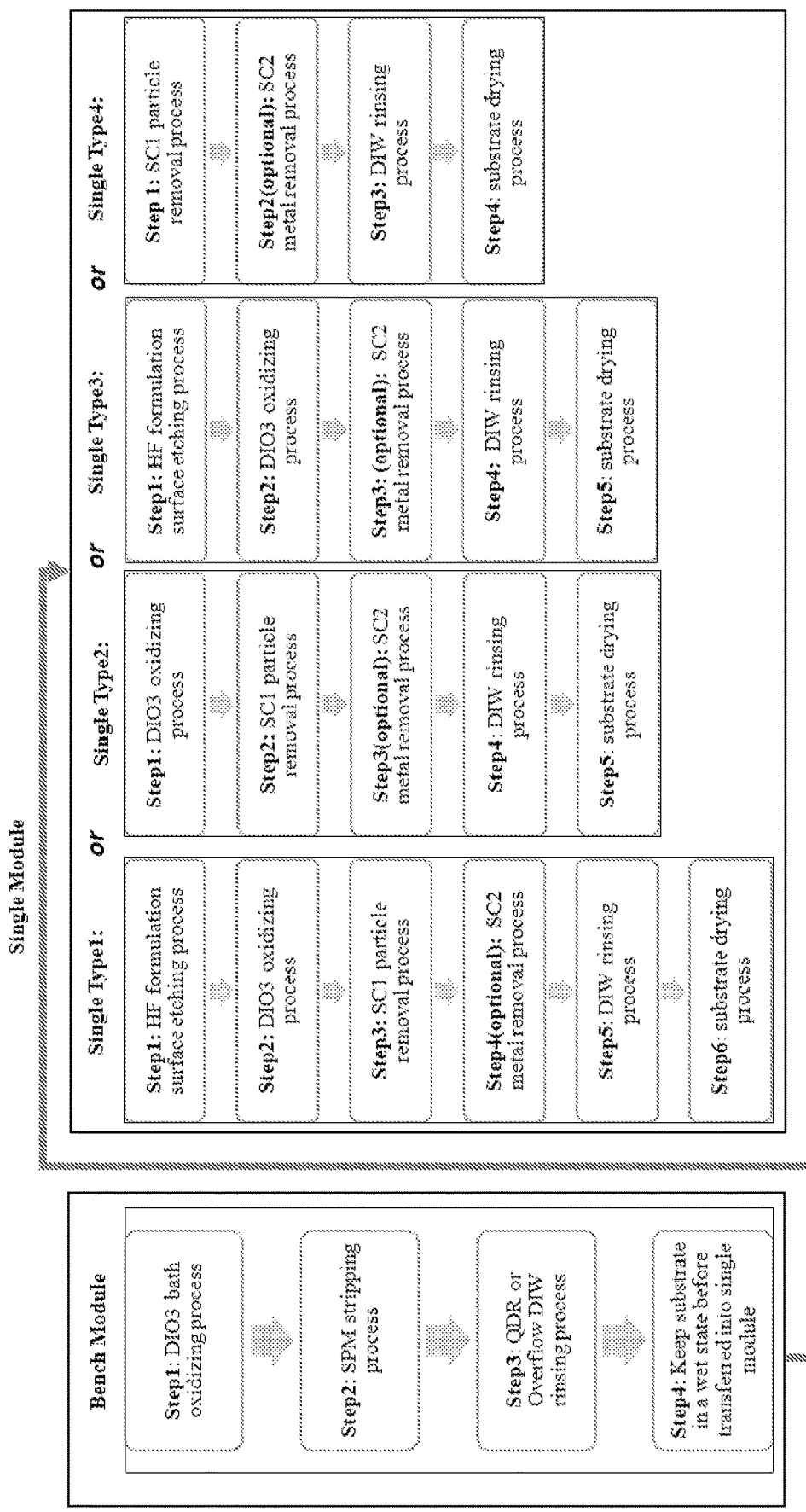
FIG. 2 illustrates a bench $DIO_3$-SPM combination process and a subsequent single substrate cleaning process in an integrated sequence according to an exemplary embodiment of the present invention.

More specifically, referring to FIG. 2, the bench $DIO_3$-SPM combination process is performed in a bench module of a Bench-Single integrated cleaning apparatus. The bench $DIO_3$-SPM combination process comprises:

transferring one or more substrates into a $DIO_3$ solution accommodated in a $DIO_3$ bath to perform a $DIO_3$ oxidizing process, wherein the $DIO_3$ is used here for photoresist pre-treatment, including oxidizing C═C double bonds and softening the photoresist crust, which would facilitate the subsequent photoresist stripping process;

after the one or more substrates are processed in the $DIO_3$ bath, taking the one or more substrates out from the $DIO_3$ bath and transferring the one or more substrates into a SPM solution accommodated in a SPM bath to perform a SPM stripping process, wherein the SPM is used here for removing the softened photoresist crust and the bulk resist by the intense chemical reaction; and after the one or more substrates are processed in the SPM bath, taking the one or more substrates out from the SPM bath and transferring the one or more substrates to a DIW bath to perform a rinsing process.

The sulfuric mixtures act as aggressive strippers during SPM cleaning process. Two types of stripping mechanisms are widely accepted. The first is dehydration mechanism: the first action is that sulfuric acid can cause organic carbonization and dehydration, by which the resist is firstly undercut and then floats away of the substrate. The second is oxidation mechanism: the mixing of sulfuric acid and hydrogen peroxide forms Caro's acid ($H_2SO_5$), which oxidizes the carbonized resist product into CO and $CO_2$ as an extremely strong oxidant.

The reactions in the SPM cleaning process are:

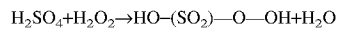

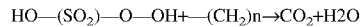

The SPM temperature in the SPM bath is critical for removing photoresist treated by high dose of ion implantation. However, a higher temperature can cause rapid decomposition of $H_2O_2$ or fast depletion of the $H_2O_2$. Therefore, the SPM used in the bench module can only be heated as high as 150° C. It is clear that for the high energy-high dose implanted resist, 150° C. SPM cannot remove the thick photoresist crust formed during ion implantation.

Therefore, the present invention discloses a method by adding $DIO_3$ (ozonized DIW) process prior to the SPM (<150° C.) process. $O_3$ is a very strong oxidant and can directly oxidize C=C double bonds, so that the thick crust of resist formed during high energy and high dose ion implantation can be softened during this reaction. After the crust of resist being softened, the underneath resist can be removed by SPM with temperature less than 150° C.

In an embodiment, the SPM solution is a mixture of $H_2SO_4$ and $H_2O_2$, and $H_2SO_4$ and $H_2O_2$ mix ratio is 3:1 to 50:1, the temperature of the mixture is 80° C. to 150° C.

In an embodiment, the rinsing process in the DIW bath comprises QDR (Quick dump drain) and overflow rinse.

In an embodiment, the ozone concentration of $DIO_3$ solution in the $DIO_3$ bath is 30 ppm to 120 ppm.

In an embodiment, the flow rate of $DIO_3$ solution supplied to the $DIO_3$ bath is 10 LPM to 30 LPM.

In an embodiment, before the one or more substrates are transferred to the $DIO_3$ bath, the liquid in the $DIO_3$ bath is DIW. A procedure of the $DIO_3$ oxidizing process further comprises:

step 1: opening a shutter of the $DIO_3$ bath, transferring the one or more substrates into the DIW in the $DIO_3$ bath, closing the shutter of the $DIO_3$ bath, in order to prevent ozone gas leakage, before the one or more substrates are transferred to the $DIO_3$ bath, the liquid in the $DIO_3$ bath is DIW;

step 2: overflowing an ozonized DIW from the $DIO_3$ bath bottom to replace the DIW in the $DIO_3$ bath;

step 3: after the $DIO_3$ bath is full of the ozonized DIW, keeping the ozonized DIW overflowing for a calculated time, in an embodiment, the time is 5 to 15 min, better 10 min;

step 4: quick dump drain the ozonized DIW;

step 5: filling the $DIO_3$ bath with pure DIW;

step 6: opening the shutter of the $DIO_3$ bath, taking the one or more semiconductor substrates out from the $DIO_3$ bath.

In the step 3, in consideration of compensating for half-life of ozone destruction and maintaining a constant ozone concentration, the $DIO_3$ supply flow rate must be high enough to refill the $DIO_3$ bath, and make sure the ozone concentration would not drop too much during process. As well known, the ozonized DIW decays rapidly and the half-life of ozonized DIW at 25° C. and pH 7.0 is typically about 15 minutes. How to compensate for half-life of ozone destruction and maintain a constant ozone concentration is important. In order to assure its strong oxidizing property, the decreasing of $DIO_3$ concentration during process should be controlled less than D=10 ppm, and the process should have a full consideration of ozone decomposition rate, fresh ozonized DIW replenishing flow rate, and an optimal $DIO_3$ process time.

Assume t is the half-life of $DIO_3$, C is the target concentration of $DIO_3$, V is the volume of the $DIO_3$ bath, the average ozone decomposition rate can be estimated as $$d = \frac{1}{2} * \frac{C}{t}$$

(instant ozone decomposition rate will vary and be bigger at higher concentration and smaller at lower concentration), the fresh ozonized DIW replenishing flow rate is r=V/(D/d). The $DIO_3$ process time is in the range of 5 min to 15 min, better to be 10 min.

In an embodiment, the ozone concentration of $DIO_3$ solution in the $DIO_3$ bath is 90 ppm, the half-life of $DIO_3$ is 15 min, the volume of the $DIO_3$ bath is 50 L, the average ozone decomposition rate is d=0.5*90/15=3 ppm/min, the fresh ozonized DIW replenishing flow rate is r=50/(10/3) =15 LPM. In consideration of using average ozone decomposition rate in the calculation, it is better to use 2r=30 LPM in practical application.

In the present invention, the $DIO_3$ bath combines both ozonized DIW and pure DIW in one bath, and the $DIO_3$ process and DIW rinsing process can be performed in one bath, solving the environment problem caused by ozone gas escaped from $DIO_3$ liquid which smells pungent and is a toxic gas which may cause harmful effects on the health.

After the one or more substrates are performed the rinsing process in the DIW bath and before the one or more substrates are transferred to the one or more single chambers of a single module of the Bench-Single integrated cleaning apparatus, keep the one or more substrates being in wet state. More specifically, transferring the one or more substrates to a wetting buffer area to keep the substrates being in wet status.

Please continue to refer to FIG. 2. In one embodiment of the present invention, the single substrate cleaning and drying process is performed in one single chamber of a single module of the Bench-Single integrated cleaning apparatus. The single substrate cleaning and drying process in one single chamber comprises:

spraying HF formulation solution on the substrate surface to perform a surface etching process;

spraying $DIO_3$ on the substrate surface to perform a $DIO_3$ oxidizing process;

spraying SC1 on the substrate surface to perform a particle removal process;

spraying DIW on the substrate surface to perform a DIW rinsing process; and drying the substrate.

Optionally, after the particle removal process by using the SC1, the single substrate cleaning and drying process can further comprise spraying SC2 on the substrate surface to perform metal removal process.

In another embodiment of the present invention, the single substrate cleaning and drying process in one single chamber comprises:

spraying $DIO_3$ on the substrate surface to perform a $DIO_3$ oxidizing process;

spraying SC1 on the substrate surface to perform a particle removal process;

spraying DIW on the substrate surface to perform a DIW rinsing process; and drying the substrate.

Optionally, after the particle removal process by using the SC1, the single substrate cleaning and drying process can further comprise spraying SC2 on the substrate surface to perform metal removal process.

In yet another embodiment of the present invention, the single substrate cleaning and drying process in one single chamber comprises:

spraying HF formulation solution on the substrate surface to perform a surface etching process;

spraying $DIO_3$ on the substrate surface to perform a $DIO_3$ oxidizing process;

spraying DIW on the substrate surface to perform a DIW rinsing process; and drying the substrate.

Optionally, after the $DIO_3$ oxidizing process, the single substrate cleaning and drying process can further comprise spraying SC2 on the substrate surface to perform metal removal process.

In yet another embodiment of the present invention, the single substrate cleaning and drying process in one single chamber comprises:

spraying SC1 on the substrate surface to perform a particle removal process;

spraying DIW on the substrate surface to perform a DIW rinsing process; and drying the substrate.

Optionally, after the particle removal process by using the SC1, the single substrate cleaning and drying process can further comprise spraying SC2 on the substrate surface to perform metal removal process.

Figure 3:
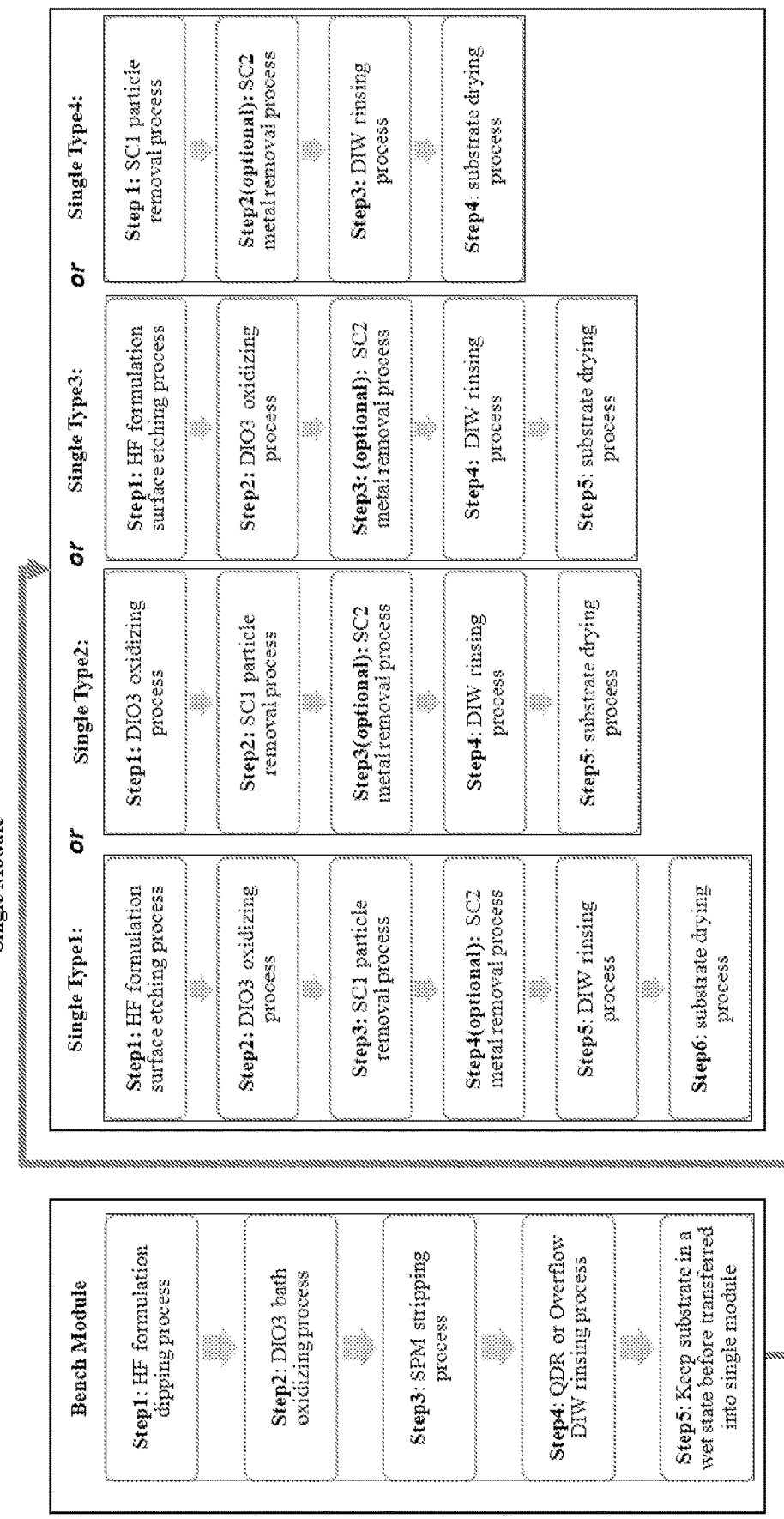
FIG. 3 illustrates another bench $DIO_3$-SPM combination process and a subsequent single substrate cleaning process in an integrated sequence according to another exemplary embodiment of the present invention.

Referring to FIG. 3, according to another embodiment of the present invention, a method for removing particles or photoresist on substrates comprises a bench $DIO_3$-SPM combination process and a subsequent single cleaning process in an integrated sequence. Comparing with the method disclosed in FIG. 2, the difference is that the method disclosed in FIG. 3 further comprises: transferring one or more substrates into a HF formulation solution accommodated in a HF formulation bath to perform a HF formulation dipping process before the one or more substrates are transferred to the $DIO_3$ bath.

In an embodiment, the HF formulation solution is a mixture of HF and DIW, and HF and DIW mix ratio is 100:1 to 1000:1.

In another embodiment, the HF formulation solution is a BOE mixture. HF weight percentage of the BOE mixture is 0.05% to 10%, and NH4F weight percentage of the BOE mixture is 10% to 40%.

According to one embodiment of the present invention, a method for removing particles or photoresist on substrates comprises a bench SPM-based process and a subsequent $DIO_3$-based single cleaning process in an integrated sequence, the method comprising:

transferring one or more substrates into a SPM solution accommodated in a SPM bath;

after the one or more substrates are processed in the SPM bath, taking the one or more substrates out from the SPM bath and rinsing the one or more substrates; and transferring the one or more substrates to one or more single chambers to perform single substrate cleaning and drying process, wherein the single substrate cleaning and drying process comprises at least one $DIO_3$ oxidizing process.

The purpose of using $DIO_3$ is to remove residual of Sulfur by products after SPM process and residuals of photoresist which have not been removed by SPM process in the previous bench module. The ozone concentration of $DIO_3$ is 30 ppm to 120 ppm, and 80 ppm is preferred.

Figure 4:
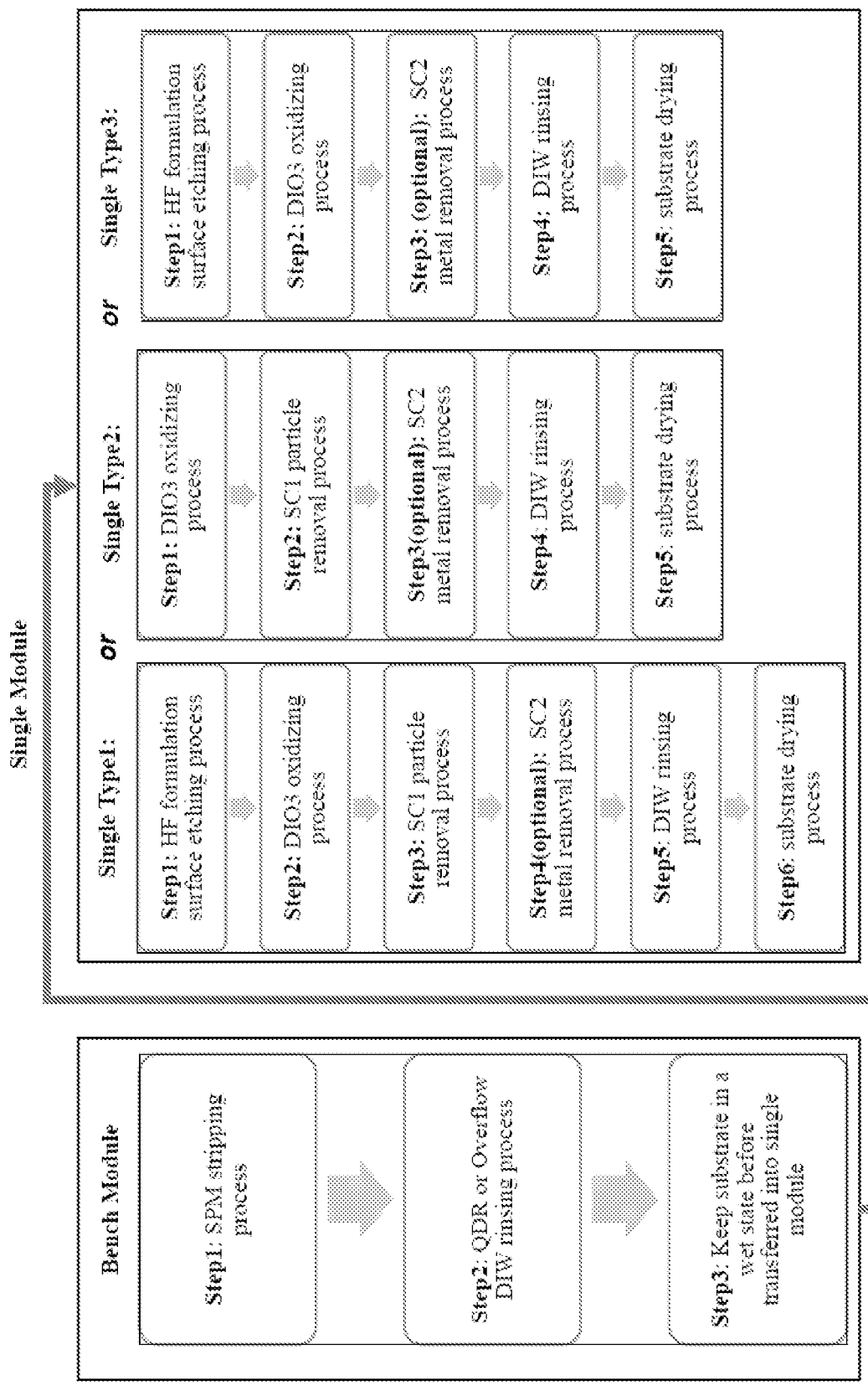
FIG. 4 illustrates a bench SPM-based process and a subsequent single substrate cleaning process including a $DIO_3$ process in an integrated sequence according to an exemplary embodiment of the present invention.

More specifically, referring to FIG. 4, the bench SPM-based process is performed in a bench module of a Bench-Single integrated cleaning apparatus. The bench SPM-based process comprises:

transferring one or more substrates into a SPM solution accommodated in a SPM bath to perform a SPM stripping process, wherein the SPM is used here for removing photoresist crust and the bulk resist by the intense chemical reaction with concentrated sulfuric acid in the bench module; and after the one or more substrates are processed in the SPM bath, taking the one or more substrates out from the SPM bath and transferring the one or more substrates to a DIW bath to perform a rinsing process.

In an embodiment, the SPM solution is a mixture of $H_2SO_4$ and $H_2O_2$, and $H_2SO_4$ and $H_2O_2$ mix ratio is 3:1 to 50:1, the temperature of the mixture is 80° C. to 150° C.

In an embodiment, the rinsing process in the DIW bath comprises QDR (Quick dump drain) and overflow rinse.

After the one or more substrates are performed the rinsing process in the DIW bath and before the one or more substrates are transferred to the one or more single chambers of a single module of the Bench-Single integrated cleaning apparatus, keep the one or more substrates being in wet state. More specifically, transferring the one or more substrates to a wetting buffer area to keep the substrates being in wet status.

Please continue to refer to FIG. 4. In one embodiment of the present invention, the $DIO_3$-based single substrate cleaning and drying process is performed in one single chamber of a single module of the Bench-Single integrated cleaning apparatus. The $DIO_3$-based single substrate cleaning and drying process in one single chamber comprises:

spraying HF formulation solution on the substrate surface to perform a surface etching process;

spraying $DIO_3$ on the substrate surface to perform a $DIO_3$ oxidizing process;

spraying SC1 on the substrate surface to perform a particle removal process;

spraying DIW on the substrate surface to perform a DIW rinsing process; and drying the substrate.

Optionally, after the particle removal process by using the SC1, the single substrate cleaning and drying process can further comprise spraying SC2 on the substrate surface to perform metal removal process.

In another embodiment of the present invention, the $DIO_3$-based single substrate cleaning and drying process is performed in one single chamber of a single module of the Bench-Single integrated cleaning apparatus. The $DIO_3$-based single substrate cleaning and drying process in one single chamber comprises:

spraying $DIO_3$ on the substrate surface to perform a $DIO_3$ oxidizing process;

spraying SC1 on the substrate surface to perform a particle removal process;

spraying DIW on the substrate surface to perform a DIW rinsing process; and drying the substrate.

Optionally, after the particle removal process by using the SC1, the single substrate cleaning and drying process can further comprise spraying SC2 on the substrate surface to perform metal removal process.

In yet another embodiment of the present invention, the $DIO_3$-based single substrate cleaning and drying process is performed in one single chamber of a single module of the Bench-Single integrated cleaning apparatus. The $DIO_3$-based single substrate cleaning and drying process in one single chamber comprises:

spraying HF formulation solution on the substrate surface to perform a surface etching process;
spraying $DIO_3$ on the substrate surface to perform a $DIO_3$ oxidizing process;
spraying DIW on the substrate surface to perform a DIW rinsing process; and
drying the substrate.

Optionally, after the $DIO_3$ oxidizing process, the single substrate cleaning and drying process can further comprise spraying SC2 on the substrate surface to perform metal removal process.

Figure 5:
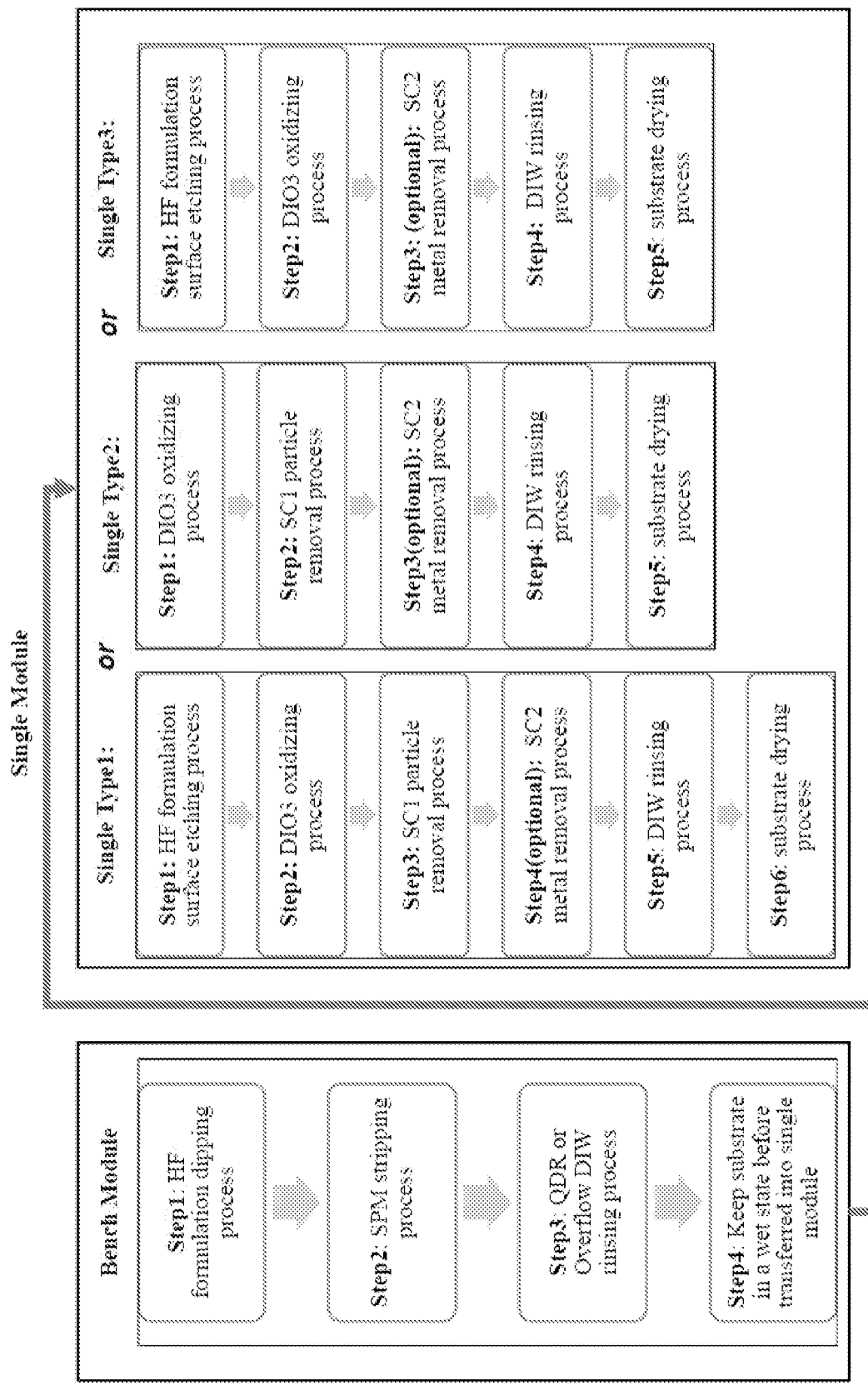
FIG. 5 illustrates another bench SPM-based process and a subsequent single substrate cleaning process including a $DIO_3$ process in an integrated sequence according to another exemplary embodiment of the present invention.

Referring to FIG. 5, according to another embodiment of the present invention, a method for removing particles or photoresist on substrates comprises a bench SPM-based process and a subsequent $DIO_3$-based single cleaning process in an integrated sequence. Comparing with the method disclosed in FIG. 4, the difference is that the method disclosed in FIG. 5 further comprises: transferring one or more substrates into a HF formulation solution accommodated in a HF formulation bath to perform a HF formulation dipping process before the one or more substrates are transferred to the SPM bath. Specifically, transferring the one or more substrates into a HF formulation solution accommodated in a HF formulation bath, after the one or more substrates are processed in the HF formulation bath, taking the one or more substrates out from the HF formulation bath and rinsing the one or more substrates, and then transferring the one or more substrates to the SPM bath. The HF formulation solution can attack photoresist, and remove Si-containing polymers and fluorocarbon polymers from the substrate sidewall, and would be benefit for subsequent SPM photoresist removal.

In an embodiment, the HF formulation solution is a mixture of HF and DIW, and HF and DIW mix ratio is 100:1 to 1000:1.

In another embodiment, the HF formulation solution is a BOE mixture. HF weight percentage of the BOE mixture is 0.05% to 10%, and NH4F weight percentage of the BOE mixture is 10% to 40%.

According to one embodiment of the present invention, a method for removing particles or photoresist on substrates comprises a $DIO_3$-based single substrate cleaning and drying process for photoresist attacking and thinning, a subsequent bench SPM-based process, and a final single substrate cleaning and drying process in an integrated sequence, the method comprising:

transferring one or more substrates to one or more single chambers to perform single substrate cleaning and drying process, wherein the single substrate cleaning and drying process comprises at least one $DIO_3$ oxidizing process;
after the one or more substrates are processed in the one or more single chambers, transferring the one or more substrates into a SPM solution accommodated in a SPM bath;
after the one or more substrates are processed in the SPM bath, taking the one or more substrates out from the SPM bath and rinsing the one or more substrates; and
transferring the one or more substrates to the one or more single chambers to perform single substrate cleaning and drying process.

Figure 6:
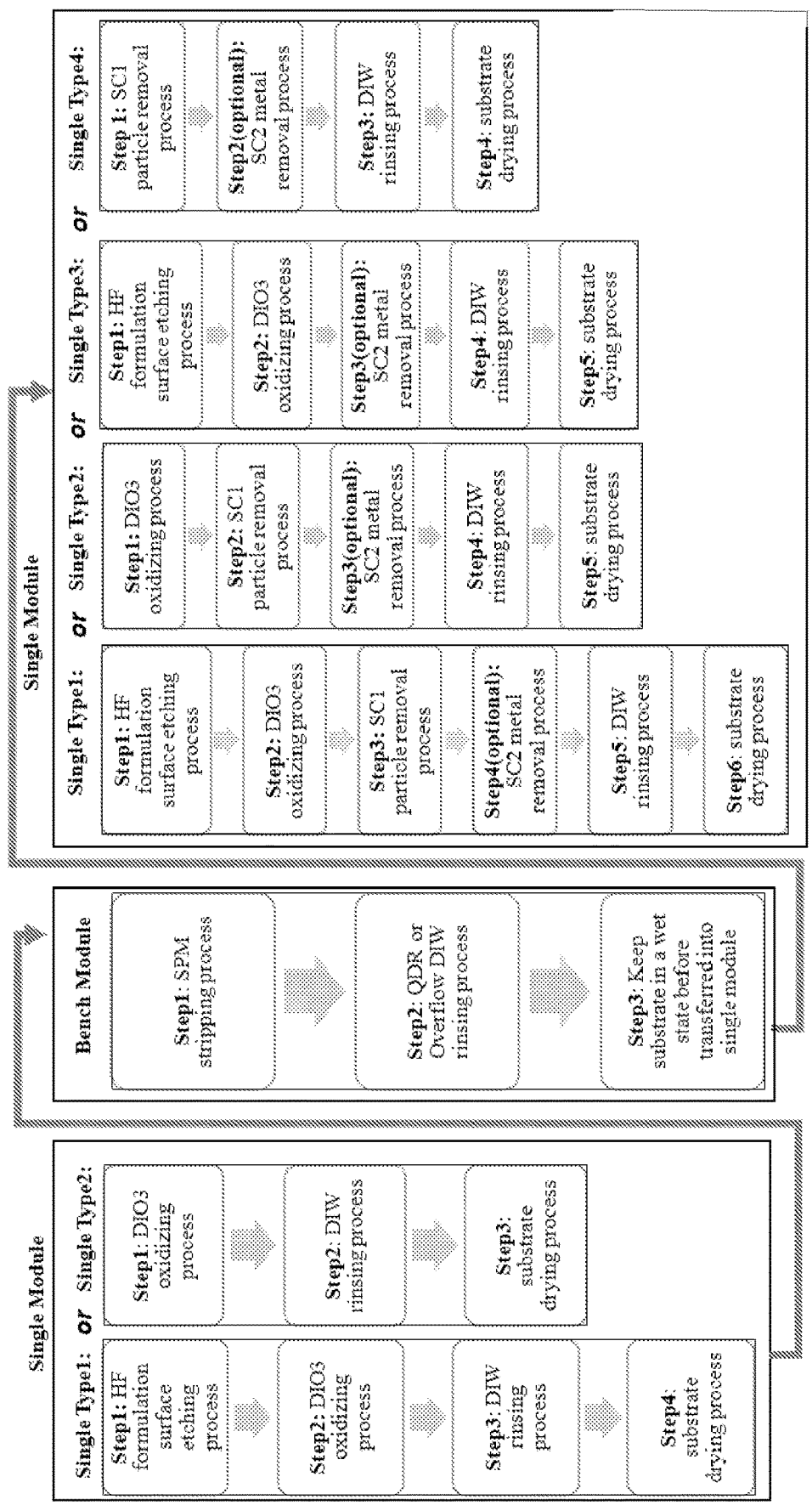
FIG. 6 illustrates a single substrate $DIO_3$-based cleaning process, a bench SPM-based process and a subsequent single substrate cleaning process in an integrated sequence according to an exemplary embodiment of the present invention.

More specifically, referring to FIG. 6, in an embodiment, the $DIO_3$-based single substrate cleaning and drying process prior to the bench SPM-based process is performed in one single chamber of a single module of a Bench-Single integrated cleaning apparatus. The $DIO_3$-based single substrate cleaning and drying process comprises: a HF formulation surface etching process, a $DIO_3$ oxidizing process, a DIW rinsing process and a drying process.

In another embodiment, the $DIO_3$-based single substrate cleaning and drying process prior to the bench SPM-based process is performed in one single chamber of a single module of a Bench-Single integrated cleaning apparatus. The $DIO_3$-based single substrate cleaning and drying process comprises: a $DIO_3$ oxidizing process, a DIW rinsing process and a drying process.

In an embodiment, the bench SPM-based process is performed in a bench module of the Bench-Single integrated cleaning apparatus. The bench SPM-based process comprises: a SPM stripping process and a DIW rinsing process.

After the one or more substrates are performed the DIW rinsing process in the bench module and before the one or more substrates are transferred to the one or more single chambers, keep the one or more substrates being in wet state. More specifically, transferring the one or more substrates to a wetting buffer area to keep the substrates being in wet status.

Similar to the method disclosed in FIG. 2, in one embodiment, the single substrate cleaning and drying process after the bench SPM-based process is performed in one single chamber of the single module of the Bench-Single integrated cleaning apparatus. The single substrate cleaning and drying process comprises: a HF formulation surface etching process, a $DIO_3$ oxidizing process, a SC1 particle removal process, a DIW rinsing process and a drying process. Optionally, after the SC1 particle removal process, the single substrate cleaning and drying process can further comprise a SC2 metal removal process.

In another embodiment, the single substrate cleaning and drying process after the bench SPM-based process is performed in one single chamber of the single module of the Bench-Single integrated cleaning apparatus. The single substrate cleaning and drying process comprises: a $DIO_3$ oxidizing process, a SC1 particle removal process, a DIW rinsing process and a drying process. Optionally, after the SC1 particle removal process, the single substrate cleaning and drying process can further comprise a SC2 metal removal process.

In yet another embodiment, the single substrate cleaning and drying process after the bench SPM-based process is performed in one single chamber of the single module of the Bench-Single integrated cleaning apparatus. The single substrate cleaning and drying process comprises: a HF formulation surface etching process, a $DIO_3$ oxidizing process, a DIW rinsing process and a drying process. Optionally, after the $DIO_3$ oxidizing process, the single substrate cleaning and drying process can further comprise a SC2 metal removal process.

In yet another embodiment, the single substrate cleaning and drying process after the bench SPM-based process is performed in one single chamber of the single module of the Bench-Single integrated cleaning apparatus. The single substrate cleaning and drying process comprises: a SC1 particle removal process, a DIW rinsing process and a drying process. Optionally, after the SC1 particle removal process, the single substrate cleaning and drying process can further comprise a SC2 metal removal process.

Figure 7:
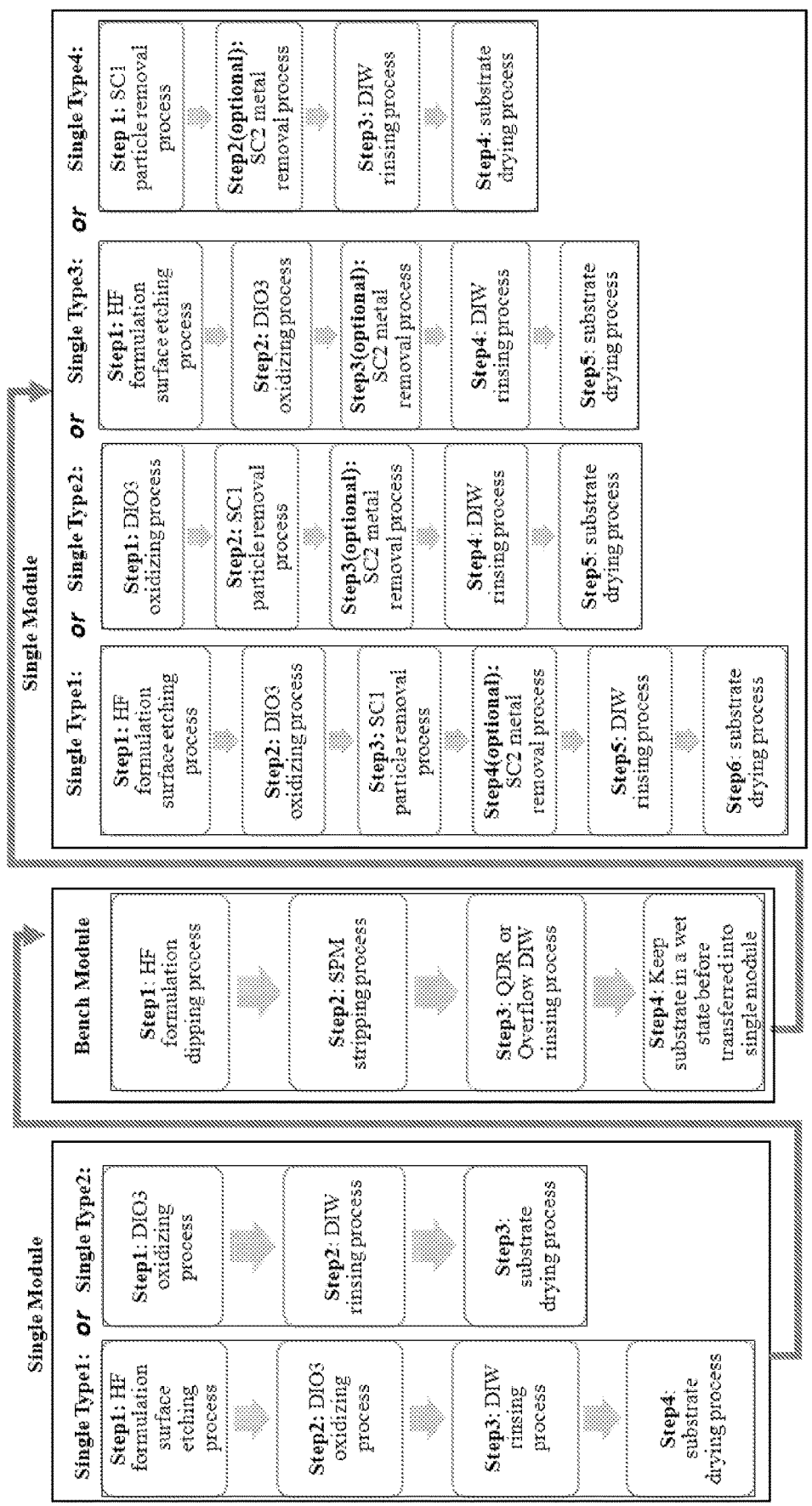
FIG. 7 illustrates another single substrate $DIO_3$-based cleaning process, a bench SPM-based process and a subsequent single substrate cleaning process in an integrated sequence according to another exemplary embodiment of the present invention.

Referring to FIG. 7, according to another embodiment of the present invention, a method for removing particles or photoresist on substrates comprises a $DIO_3$-based single substrate cleaning and drying process for photoresist attacking and thinning, a subsequent bench SPM-based process, and a final single substrate cleaning and drying process in an integrated sequence. Comparing with the method disclosed in FIG. 6, the difference is that the method disclosed in FIG. 7 further comprises: a HF formulation dipping process prior to the SPM stripping process.

In all embodiments described above in the present invention, the $DIO_3$ is solution dissolved ozone in DIW. The SC1 is a mixture of ammonium hydroxide and hydrogen peroxide in deionized water, sometime called "standard clean-1". The SC2 is a mixture of hydrochloric acid and hydrogen peroxide in deionized water, sometime called "standard clean-2".

It should be recognized that in the single chamber, one DIW rinsing process can be inserted between any two chemical processes. For example, between the $DIO_3$ oxidizing process and the SC1 particle removal process, one DIW rinsing process can be inserted there between.

The present invention discloses an apparatus for removing particles or photoresist on substrates. The apparatus includes a bench module configured to implement one or more substrates bench cleaning process, a single module having multiple single chambers configured to implement single substrate cleaning and drying process and a process robot configured to transfer the one or more substrates between the bench module and the single module, wherein the bench module has at least one $DIO_3$ bath configured to accommodate $DIO_3$ solution for processing the one or more substrates, at least one SPM bath configured to accommodate SPM solution for processing the one or more substrates, at least one DIW bath configured to accommodate DIW for rinsing the one or more substrates, and at least one second substrate transfer robot configured to transfer the one or more substrates among the $DIO_3$ bath, the SPM bath and the DIW bath.

Figure 8:
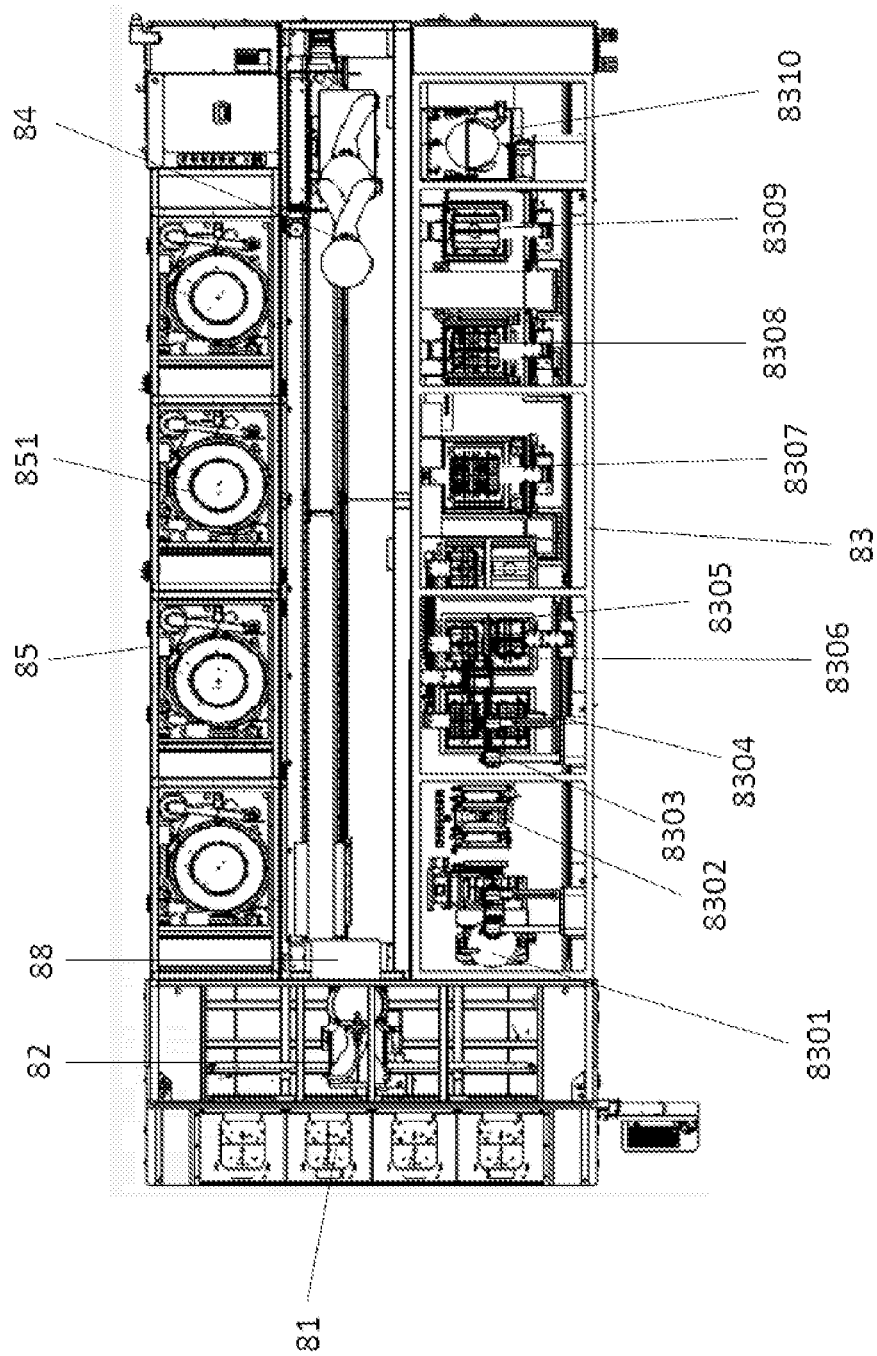
FIG. 8 illustrates a top view of an apparatus for removing particles or photoresist on substrates according to an exemplary embodiment of the present invention.
Figure 9:
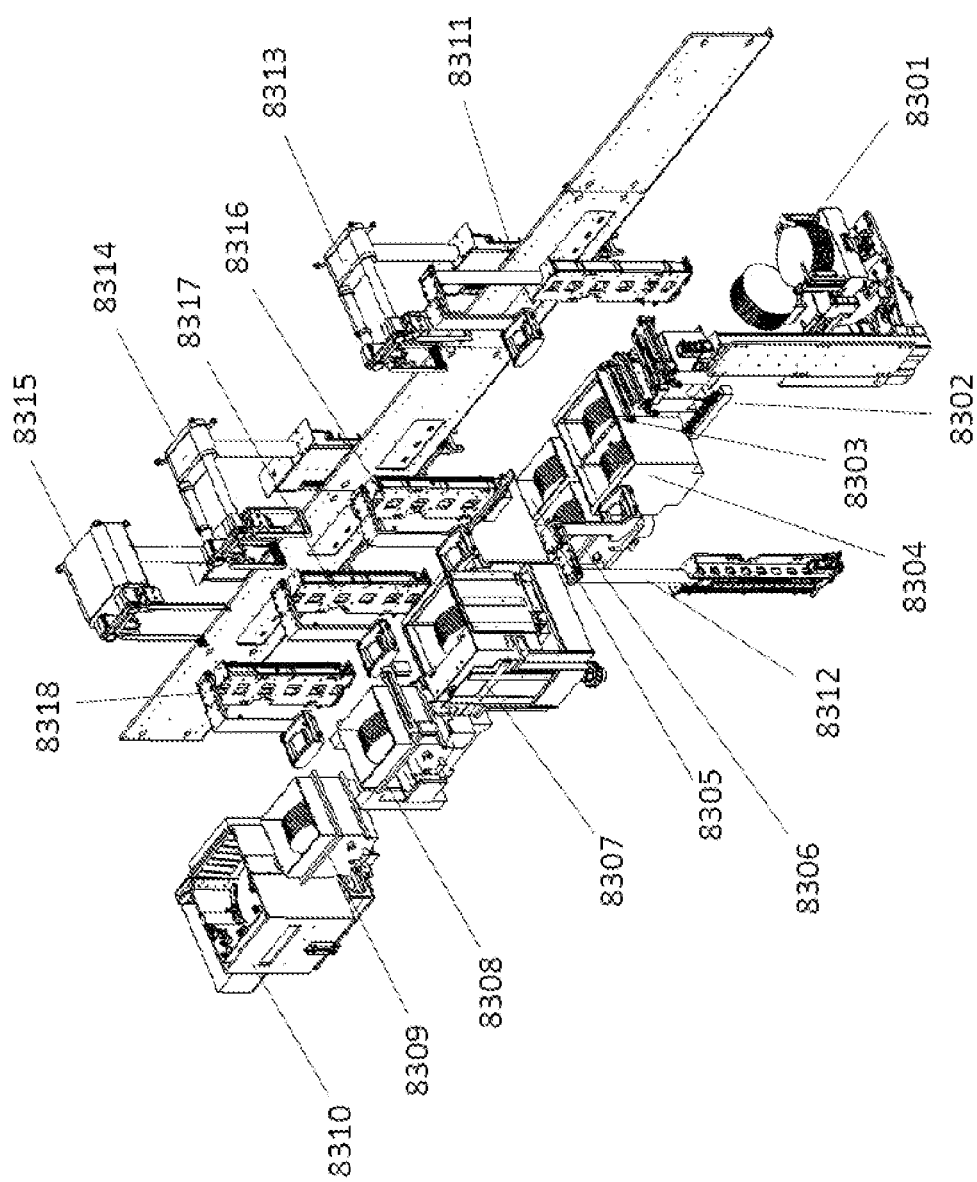
FIG. 9 illustrates a perspective view of a bench module of the apparatus shown in FIG. 8.

More specifically, referring to FIG. 8 and FIG. 9, an apparatus for removing particles or photoresist on substrates according to one exemplary embodiment of the present invention is illustrated. The apparatus includes a plurality of, e.g. four load ports 81 each of which receives a FOUP, an index robot 82, a buffer 88, a bench module 83, a process robot 84 and a single module 85 having multiple single chambers 851.

The bench module 83 includes a substrate loader 8301, a cleaning bath 8302, a first HF formulation bath 8303, a second HF formulation bath 8304, a first $DIO_3$ bath 8305, a second $DIO_3$ bath 8306, a SPM bath 8307, a first DIW bath 8308, a second DIW bath 8309, a wetting buffer area 8310, a first substrate transfer robot 8313, a second substrate transfer robot 8314, a third substrate transfer robot 8315, a first lifter 8311, a second lifter 8312, a third lifter 8316, a fourth lifter 8317 and a fifth lifter 8318.

When the apparatus is used for removing particles or photoresist on substrates, the process sequence is as follow.

The index robot 82 gets one or more substrates from one FOUP and transfers the one or more substrates to the substrate loader 8301 by one time or several times. The substrate loader 8301 holds the one or more substrates and then makes the one or more substrates rotate 90 degrees along the horizontal axis and rotate another 90 degrees along the vertical axis so that the one or more substrates are vertically held by the substrate loader 8301.

The first substrate transfer robot 8313 gets the one or more substrates, e.g. 13 pieces of substrates or 12 pieces of substrates from the substrate loader 8301 and transfers the one or more substrates to the first lifter 8311. The first lifter 8311 holds the one or more substrates and brings the one or more substrates to immerse into HF formulation solution accommodated in the first HF formulation bath 8303. The first substrate transfer robot 8313 gets another one or more substrates from the substrate loader 8301 and transfers the one or more substrates to the second lifter 8312. The second lifter 8312 holds the one or more substrates and brings the one or more substrates to immerse into HF formulation solution accommodated in the second HF formulation bath 8304.

After the process in the first HF formulation bath 8303 or the process in the second HF formulation bath 8304 completes, the second substrate transfer robot 8314 gets the one or more substrates from the first HF formulation bath 8303 and transfers the one or more substrates to the first $DIO_3$ bath 8305, or the second substrate transfer robot 8314 gets the one or more substrates from the second HF formulation bath 8304 and transfers the one or more substrates to the second $DIO_3$ bath 8306. In order to reduce the risk of water mark formed on the substrate surface, it is better to control the transfer time to be less than 20 seconds, and better to be less than 10 seconds. The first lifter 8311 and the second lifter 8312 respectively rise to be above the first HF formulation bath 8303 and the second HF formulation bath 8304. In this embodiment, the first HF formulation bath 8303, the second HF formulation bath 8304, the first $DIO_3$ bath 8305, and the second $DIO_3$ bath 8306 are arranged in two rows, and each row has one HF formulation bath and one adjacent $DIO_3$ bath.

After the process in the first $DIO_3$ bath 8305 or the process in the second $DIO_3$ bath 8306 completes, the second substrate transfer robot 8314 gets the one or more substrates from the first $DIO_3$ bath 8305 or the second $DIO_3$ bath 8306 and transfers the one or more substrates to the third lifter 8316. The third lifter 8316 brings the one or more substrates to immerse into SPM solution accommodated in the SPM bath 8307.

After the process in the SPM bath 8307 completes, the third lifter 8316 rises to be above the SPM bath 8307 and the second substrate transfer robot 8314 gets the one or more substrates from the third lifter 8316 and transfers the one or more substrates to the fourth lifter 8317 or the fifth lifter 8318. The fourth lifter 8317 or the fifth lifter 8318 brings the one or more substrates to the first DIW bath 8308 or the second DIW bath 8309 to implement QDR (Quick dump drain) or overflow rinsing process.

After the one or more substrates are processed in the first DIW bath 8308 or the second DIW bath 8309, the fourth lifter 8317 or the fifth lifter 8318 rises to be above the first DIW bath 8308 or the second DIW bath 8309, and the third substrate transfer robot 8315 gets the one or more substrates from the fourth lifter 8317 or the fifth lifter 8318 and transfers the one or more substrates to the wetting buffer area 8310 by one time or several times. In the wetting buffer area 8310, the one or more substrates can be rotated from vertical to horizontal and kept in wet status before the one or more substrates are transferred to the one or more single chambers 851 of the single module 85. During this waiting period, the substrates in the wetting buffer area 8310 can be sprayed by DI water to keep the substrate surface wet.

The process robot 84 gets the one or more substrates from the wetting buffer area 8310 and transfers the one or more substrates to the one or more single chambers 851 to implement single substrate cleaning and drying process.

After the single substrate cleaning and drying process complete in one single chamber 851, the process robot 84 gets the substrate from the single chamber 851 and transfers it to the buffer 88, and then the index robot 82 gets the substrate from the buffer 88 and transfers it back to the FOUP.

In the bench module 83, the cleaning bath 8302 is used for cleaning the second substrate transfer robot 8314 while the second substrate transfer robot 8314 is idle.

Figure 10:
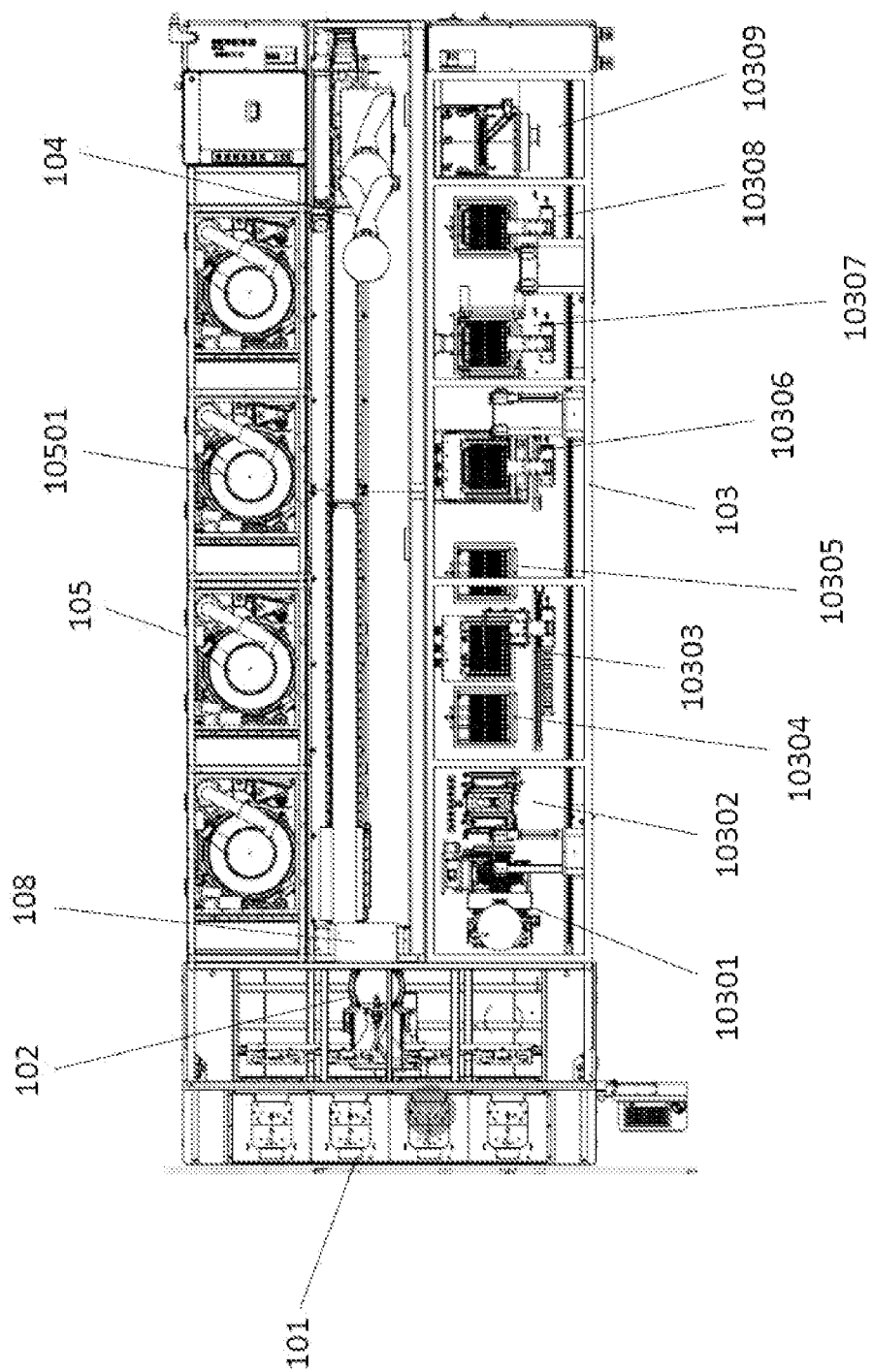
FIG. 10 illustrates a top view of an apparatus for removing particles or photoresist on substrates according to another exemplary embodiment of the present invention.
Figure 11:
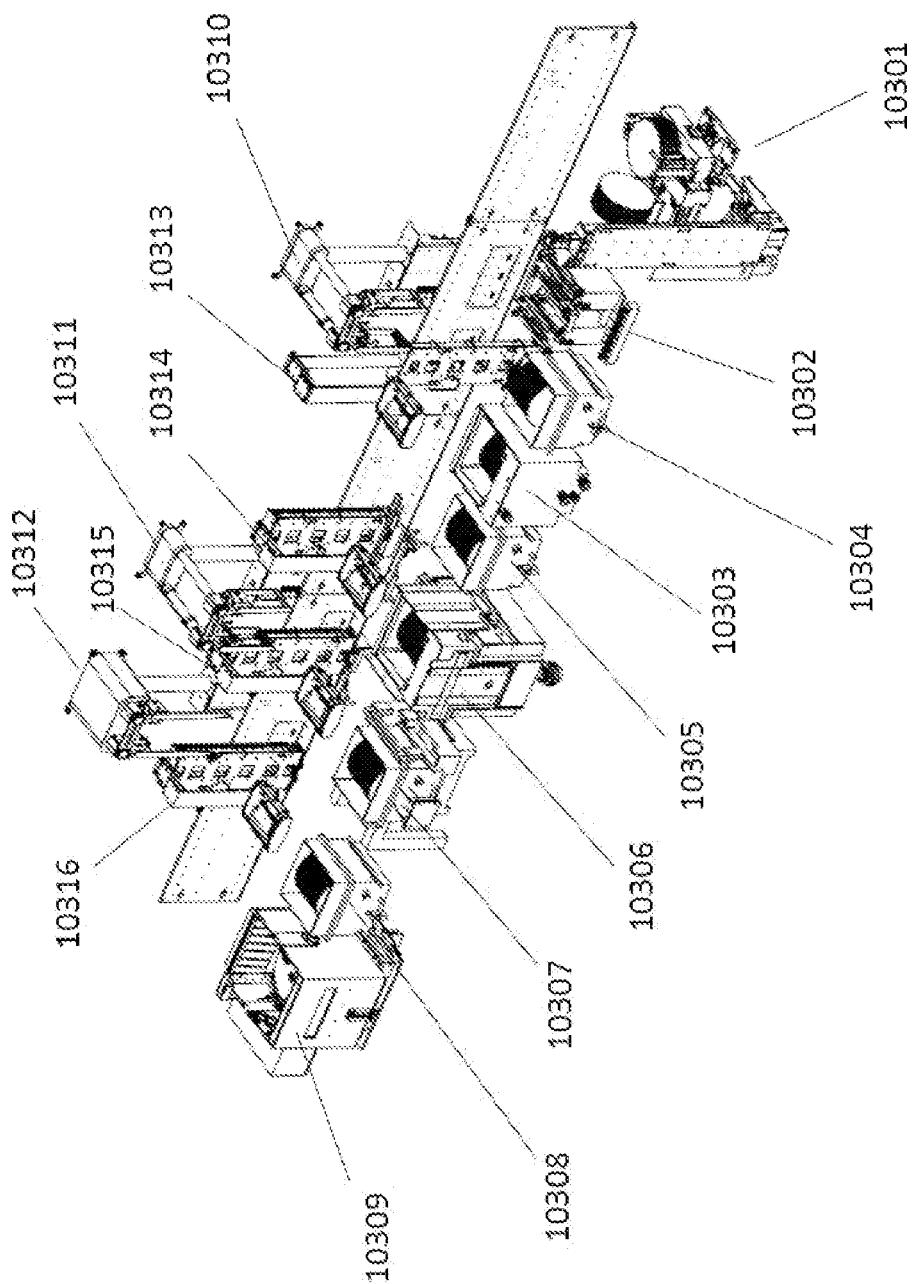
FIG. 11 illustrates a perspective view of a bench module of the apparatus shown in FIG. 10.

Referring to FIG. 10 and FIG. 11, an apparatus for removing particles or photoresist on substrates according to another exemplary embodiment of the present invention is illustrated. The apparatus includes a plurality of, e.g. four load ports 101 each of which receives a FOUP, an index robot 102, a buffer 108, a bench module 103, a process robot 104 and a single module 105 having multiple single chambers 10501.

The bench module 103 includes a substrate loader 10301, a cleaning bath 10302, a HF formulation bath 10303, a first $DIO_3$ bath 10304, a second $DIO_3$ bath 10305, a SPM bath 10306, a first DIW bath 10307, a second DIW bath 10308, a wetting buffer area 10309, a first substrate transfer robot 10310, a second substrate transfer robot 10311, a third substrate transfer robot 10312, a first lifter 10313, a third lifter 10314, a fourth lifter 10315 and a fifth lifter 10316.

Comparing with the apparatus shown in FIG. 8 and FIG. 9, the apparatus shown in this embodiment has one HF formulation bath 10303 and the HF formulation bath 10303 is set between the first $DIO_3$ bath 10304 and the second $DIO_3$ bath 10305. Comparing with the apparatus shown in FIG. 8 and FIG. 9, since the apparatus shown in this embodiment is lack of a second HF formulation bath, and accordingly, the apparatus shown in this embodiment is lack of a second lifter. The substrate transfer sequence is similar to that of embodiment shown in FIG. 8 and FIG. 9, which will not be repeat described herein.

Figure 12B:
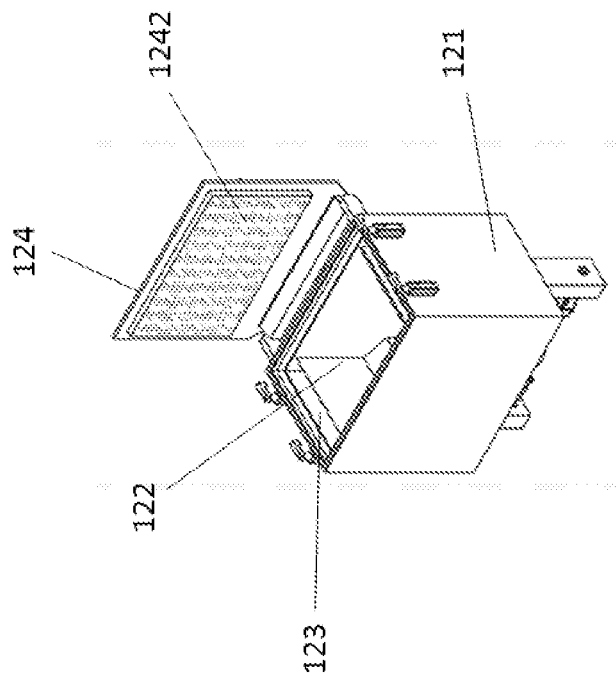
FIG. 12B illustrates a perspective view of the $DIO_3$ bath of which shutter is open.
Figure 12A:
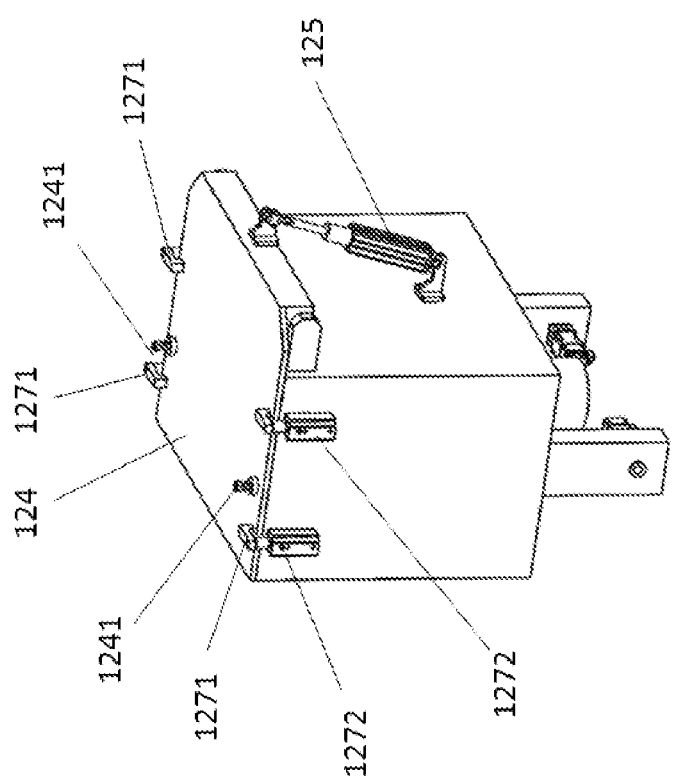
FIG. 12A illustrates a perspective view of a $DIO_3$ bath according to an exemplary embodiment of the present invention.
Figure 12C:
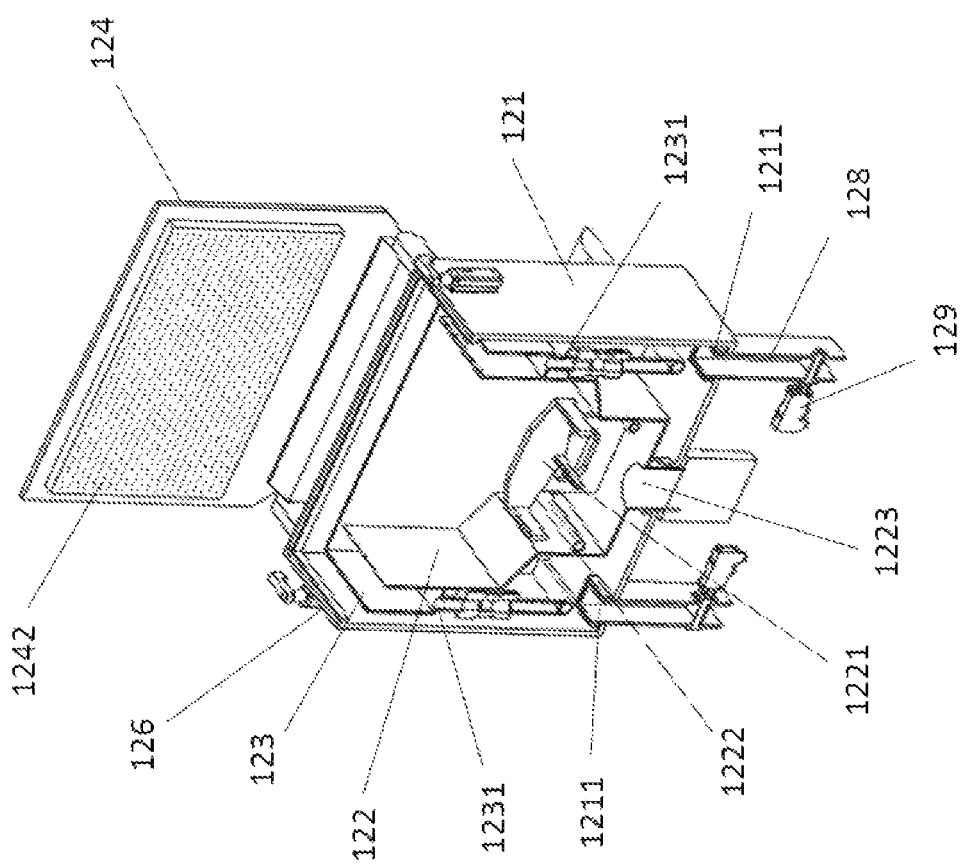
FIG. 12C illustrates a cross-sectional view of the $DIO_3$ bath shown in FIG. 12B.

Please refer to FIGS. 12A-12C. A $DIO_3$ bath according to an exemplary embodiment of the present invention is illustrated. The $DIO_3$ bath has an outer bath 121, an inner bath 122, two overflow grooves 123, a shutter 124 and a driving device 125.

The bottom of the outer bath 121 sets two exhaust ports 1211. Two exhaust lines 128 are respectively connected to the two exhaust ports 1211 of the outer bath 121. A pressure monitor and a pressure damper 129 are respectively set on the two exhaust lines 128. The material of the outer bath 121 can select PVC.

The inner bath 122 is set in the outer bath 121 and configured to accommodate $DIO_3$ solution. The inner bath 122 has a substrate holding pedestal 1221 configured to supporting and holding the one or more substrates. Two liquid inlet pipes 1222 are set in the inner bath 122 and configured to supply liquid to the inner bath 122. A drain port 1223 is set at the bottom of the inner bath 122 and configured to drain the liquid in the inner bath 122 to the outside of the $DIO_3$ bath. Preferably, the drain port 1223 is a quick drain port. The inner bath 122 is made of high purity quartz materials.

The two overflow grooves 123 are set at both sides of the inner bath 122. Each overflow groove 123 has two drain holes 1231 configured to drain the liquid in the overflow groove 123 to the outside of the $DIO_3$ bath.

The shutter 124 is set on the outer bath 121 to seal the outer bath 121. The shutter 124 has at least one gas intake 1241 set on the top side of the shutter 124 and a plurality of exhaust holes 1242 set on the bottom side of the shutter 124. The driving device 125 is connected to the shutter 124 and configured to open or close the shutter 124.

For better seal, preferably, a seal ring 126 is set on the top of the outer bath 121. At least one pair of locking devices are set on the outer bath 121 to lock the shutter 124 while the shutter 124 is closed. Each locking device has a lock head 1271 and an actuator 1272 connected to the lock head 1271 and driving the lock head 1271 to rotate and rise and fall. After the shutter 124 is closed, the actuator 1272 drives the lock head 1271 to rotate to be above the shutter 124 and then the actuator 1272 drives the lock head 1271 to fall so that the lock head 1271 locks the shutter 124. When the shutter 124 needs to open, the actuator 1272 drives the lock head 1271 to rise and then the actuator 1272 drives the lock head 1271 to rotate to make the lock head 1271 leave the shutter 124 so that the shutter 124 can be open.

During process, when the one or more substrates are transferred into the $DIO_3$ bath and held by the substrate holding pedestal 1221, the shutter 124 is closed to seal the $DIO_3$ bath to prevent ozone gas from leaking to the peripheral environment. Ozone smells pungent and it is a toxic gas which may cause harmful effects on the health. In that case, for safety protection, how to seal the $DIO_3$ bath and keep a very low ambient ozone level is challenging and important.

In this embodiment, the inner bath 122 is used for accommodating $DIO_3$. The two overflow grooves 123 are used as a $DIO_3$ overflow area. The outer bath 121 is used for exhausting gas. There is a gap between the top of the inner bath 122 and the top the outer bath 121, which can ensure enough area for exhausting gas, preventing the ozone gas from leaking from the outer bath 121. Furthermore, the present invention also discloses an ozone gas anti-leakage structure. Specifically, a purge gas, such as $N_2$ or CDA is supplied to the outer bath 121 through the at least one gas intake 1241 set on the top side of the shutter 124 and a plurality of exhaust holes 1242 set on the bottom side of the shutter 124. Purge gas is provided into the outer bath 121, serving as a gas carrier to prevent the ozone gas from leaking to the peripheral environment. Meanwhile, it's important to control the exhaust pressure in the outer bath 121 to balance the gas intake and output, which can be realized by the pressure monitor and the pressure damper 129.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A method for removing particles or photoresist on substrates, comprising:
   transferring one or more substrates into a $DIO_3$ solution accommodated in a $DIO_3$ bath;
   after the one or more substrates are processed in the $DIO_3$ bath, taking the one or more substrates out from the $DIO_3$ bath and transferring the one or more substrates into a SPM solution accommodated in a SPM bath;
   after the one or more substrates are processed in the SPM bath, taking the one or more substrates out from the SPM bath and rinsing the one or more substrates;
   transferring the one or more substrates to one or more single chambers to perform single substrate cleaning and drying process;
   wherein before the one or more substrates are transferred to the $DIO_3$ bath, the liquid in the $DIO_3$ bath is DIW, and further comprising:

opening a shutter of the $DIO_3$ bath, transferring the one or more substrates into the DIW in the $DIO_3$ bath, closing the shutter of the $DIO_3$ bath;

overflowing an $DIO_3$ solution from a bottom of the $DIO_3$ bath to replace the DIW in the $DIO_3$ bath, wherein ozone concentration of the $DIO_3$ solution is 30 ppm to 120 ppm;

after the $DIO_3$ bath is full of the $DIO_3$ solution, keeping the $DIO_3$ solution overflowing for 5 to 15 min;

quick dump drain the $DIO_3$ solution;

filling the $DIO_3$ bath with pure DIW; and opening the shutter of the $DIO_3$ bath, taking the one or more substrates out from the $DIO_3$ bath.

2. The method as claimed in claim 1, further comprising:

transferring the one or more substrates into a HF formulation solution accommodated in a HF formulation bath before the one or more substrates are transferred to the $DIO_3$ bath.

3. The method as claimed in claim 2, wherein the HF formulation solution is a mixture of HF and DIW, and HF and DIW mix ratio is 100:1 to 1000:1.

4. The method as claimed in claim 2, wherein the HF formulation solution is a BOE mixture, HF weight percentage of the BOE mixture is 0.05% to 10%, $NH_4F$ weight percentage of the BOE mixture is 10% to 40%.

5. The method as claimed in claim 1, wherein the $DIO_3$ flow rate supplied to the $DIO_3$ bath is 10 LPM to 30 LPM.

6. The method as claimed in claim 1, wherein the SPM solution is a mixture of $H_2SO_4$ and $H_2O_2$, and $H_2SO_4$ and $H_2O_2$ mix ratio is 3:1 to 50:1, the temperature of the mixture is 80° C. to 150° C.

7. The method as claimed in claim 1, wherein the step of rinsing the one or more substrates comprises QDR (Quick dump drain) and overflow rinse.

8. The method as claimed in claim 1, further comprising after the one or more substrates are taken out from the SPM bath, keeping the one or more substrates being in wet state before the one or more substrates are transferred to the one or more single chambers.

9. The method as claimed in claim 1, wherein the process in the one or more single chambers comprises:

at least one HF formulation surface etching process, at least one $DIO_3$ oxidizing process, at least one SC1 particle removal process, at least one DIW rinsing process and at least one drying process.

10. The method as claimed in claim 9, wherein after the SC1 particle removal process, further comprises at least one SC2 metal removal process.

11. The method as claimed in claim 1, wherein the process in the one or more single chambers comprises:

at least one $DIO_3$ oxidizing process, at least one SC1 particle removal process, at least one DIW rinsing process and at least one drying process.

12. The method as claimed in claim 11, wherein after the SC1 particle removal process, further comprises at least one SC2 metal removal process.

13. The method as claimed in claim 1, wherein the process in the one or more single chambers comprises:

at least one HF formulation surface etching process, at least one $DIO_3$ oxidizing process, at least one DIW rinsing process and at least one drying process.

14. The method as claimed in claim 13, wherein after the $DIO_3$ oxidizing process, further comprises at least one SC2 metal removal process.

15. The method as claimed in claim 1, wherein the process in the one or more single chambers comprises:

at least one SC1 particle removal process, at least one DIW rinsing process and at least one drying process.

16. The method as claimed in claim 15, wherein after the SC1 particle removal process, further comprises at least one SC2 metal removal process.

17. A method for removing particles or photoresist on substrates, comprising:

transferring one or more substrates into a SPM solution accommodated in a SPM bath;

after the one or more substrates are processed in the SPM bath, taking the one or more substrates out from the SPM bath and rinsing the one or more substrates; and transferring the one or more substrates to one or more single chambers to perform single substrate cleaning and drying process, wherein the single substrate cleaning and drying process comprises at least one $DIO_3$ oxidizing process;

wherein the at least one $DIO_3$ oxidizing process comprising:

opening a shutter of a $DIO_3$ bath, transferring the one or more substrates into a DIW in a $DIO_3$ bath, closing a shutter of the $DIO_3$ bath;

overflowing a $DIO_3$ solution from a bottom of the $DIO_3$ bath to replace the DIW in the $DIO_3$ bath, wherein ozone concentration of the $DIO_3$ solution is 30 ppm to 120 ppm;

after the $DIO_3$ bath is full of the $DIO_3$ solution, keeping the $DIO_3$ solution overflowing for 5 to 15 min;

quick dump drain the $DIO_3$ solution;

filling the $DIO_3$ bath with pure DIW; and opening the shutter of the $DIO_3$ bath, taking the one or more substrates out from the $DIO_3$ bath.

18. The method as claimed in claim 17, further comprising:

transferring the one or more substrates into a HF formulation solution accommodated in a HF formulation bath, taking the one or more substrates out from the HF formulation bath and rinsing the one or more substrates before the one or more substrates are transferred to the SPM bath.

19. The method as claimed in claim 18, wherein the HF formulation solution is a mixture of HF and DIW, and HF and DIW mix ratio is 100:1 to 1000:1.

20. The method as claimed in claim 18, wherein the HF formulation solution is a BOE mixture, HF weight percentage of the BOE mixture is 0.05% to 10%, $NH_4F$ weight percentage of the BOE mixture is 10% to 40%.

21. The method as claimed in claim 17, wherein the SPM solution is a mixture of $H_2SO_4$ and $H_2O_2$, and $H_2SO_4$ and $H_2O_2$ mix ratio is 3:1 to 50:1, the temperature of the mixture is 80° C. to 150° C.

22. The method as claimed in claim 17, wherein the step of rinsing the one or more substrates comprises QDR (Quick dump drain) and overflow rinse.

23. The method as claimed in claim 17, further comprising after the one or more substrates are taken out from the SPM bath, keeping the one or more substrates being in wet state before the one or more substrates are transferred to the one or more single chambers.

24. The method as claimed in claim 17, wherein the process in the one or more single chambers further comprises:

at least one HF formulation surface etching process before the $DIO_3$ oxidizing process, at least one SC1 particle removal process, at least one DIW rinsing process and at least one drying process.

25. The method as claimed in claim 24, wherein after the SC1 particle removal process, further comprises at least one SC2 metal removal process.

26. The method as claimed in claim 17, wherein the process in the one or more single chambers further comprises:
at least one SC1 particle removal process, at least one DIW rinsing process and at least one drying process.

27. The method as claimed in claim 26, wherein after the SC1 particle removal process, further comprises at least one SC2 metal removal process.

28. The method as claimed in claim 17, wherein the process in the one or more single chambers further comprises:
at least one HF formulation surface etching process before the $DIO_3$ oxidizing process, at least one DIW rinsing process and at least one drying process.

29. The method as claimed in claim 28, wherein after the $DIO_3$ oxidizing process, further comprises at least one SC2 metal removal process.

30. A method for removing particles or photoresist on substrates, comprising:
transferring one or more substrates to one or more single chambers to perform single substrate cleaning and drying process, wherein the single substrate cleaning and drying process comprises at least one $DIO_3$ oxidizing process;
after the one or more substrates are processed in the one or more single chambers, transferring the one or more substrates into a SPM solution accommodated in a SPM bath;
after the one or more substrates are processed in the SPM bath, taking the one or more substrates out from the SPM bath and rinsing the one or more substrates; and
transferring the one or more substrates to the one or more single chambers to perform single substrate cleaning and drying process;
wherein the at least one $DIO_3$ oxidizing process comprising:
opening a shutter of a $DIO_3$ bath, transferring the one or more substrates into a DIW in a $DIO_3$ bath, closing a shutter of the $DIO_3$ bath;
overflowing a $DIO_3$ solution from a bottom of the $DIO_3$ bath to replace the DIW in the $DIO_3$ bath, wherein ozone concentration of the $DIO_3$ solution is 30 ppm to 120 ppm;
after the $DIO_3$ bath is full of the $DIO_3$ solution, keeping the $DIO_3$ solution overflowing for 5 to 15 min;
quick dump drain the $DIO_3$ solution;
filling the $DIO_3$ bath with pure DIW; and
opening the shutter of the $DIO_3$ bath, taking the one or more substrates out from the $DIO_3$ bath.

31. The method as claimed in claim 30, further comprising transferring the one or more substrates into a HF formulation solution accommodated in a HF formulation bath, taking the one or more substrates out from the HF formulation bath and rinsing the one or more substrates before the one or more substrates are transferred to the SPM bath.

32. The method as claimed in claim 30, further comprising after the one or more substrates are taken out from the SPM bath, keeping the one or more substrates being in wet state before the one or more substrates are transferred to the one or more single chambers.

* * * * *